(12) United States Patent
Codato et al.

(10) Patent No.: US 7,539,228 B2
(45) Date of Patent: May 26, 2009

(54) INTEGRATED PHOTONIC SEMICONDUCTOR DEVICES HAVING RIDGE STRUCTURES THAT ARE GROWN RATHER THAN ETCHED, AND METHODS FOR MAKING SAME

(75) Inventors: Simone Codato, Cirie' (IT); Fang Ruiyu, Turin (IT); Rigo Cesare, Chieri (IT); Guido Alberto Roggero, Cirie' (IT); Marzia Rosso, Rivalta (IL)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 175 days.

(21) Appl. No.: 11/768,214

(22) Filed: Jun. 26, 2007

(65) Prior Publication Data

US 2009/0003396 A1 Jan. 1, 2009

(51) Int. Cl.
*H01S 5/00* (2006.01)
(52) U.S. Cl. .................................. 372/45.01; 438/32
(58) Field of Classification Search .............. 372/43.01, 372/26, 45.01, 50.1, 46.1; 438/32; 385/14
See application file for complete search history.

(56) References Cited

U.S. PATENT DOCUMENTS

| | | | |
|---|---|---|---|
| 4,575,919 A * | 3/1986 | Logan et al. | 438/32 |
| 4,872,180 A | 10/1989 | Rideout et al. | |
| 5,717,710 A | 2/1998 | Miyazaki et al. | |
| 6,134,368 A | 10/2000 | Sakata | |
| 6,197,608 B1 | 3/2001 | Ha | |
| 6,391,671 B2 | 5/2002 | Inomoto et al. | |
| 6,542,533 B1 | 4/2003 | Parayanthal | |
| 6,973,226 B2 | 12/2005 | Sato et al. | |
| 2001/0019568 A1* | 9/2001 | Sakata | 372/50 |
| 2003/0067010 A1 | 4/2003 | Iga et al. | |
| 2004/0048406 A1* | 3/2004 | Ikeda et al. | 438/29 |

FOREIGN PATENT DOCUMENTS

EP 0 760 544 A1 3/1997

* cited by examiner

*Primary Examiner*—Minsun Harvey
*Assistant Examiner*—Tuan N. Nguyen

(57) ABSTRACT

A SAG technique is used to grow the ridge structure in a photonic semiconductor device, such as an electroabsorption modulator integrated with a distributed feedback laser (EML) assembly. The adoption of this SAG technique to grow the ridge structure results in the formation of a self-assembled and self-aligned ridge structure that has a very precise configuration. The use of this process enables straight, bent and tilted ridge structures to be formed with high precision. In addition, because the ridge structure is self-assembled and self-aligned, a lesser number of processing steps are required to create the photonic device in comparison to the known approach that uses wet chemical etching techniques to form the ridge structure. The high precision of the ridge structure and the lesser number of processing steps needed to create the device increase manufacturing yield and allow overall cost of the device to be reduced.

22 Claims, 17 Drawing Sheets major flat

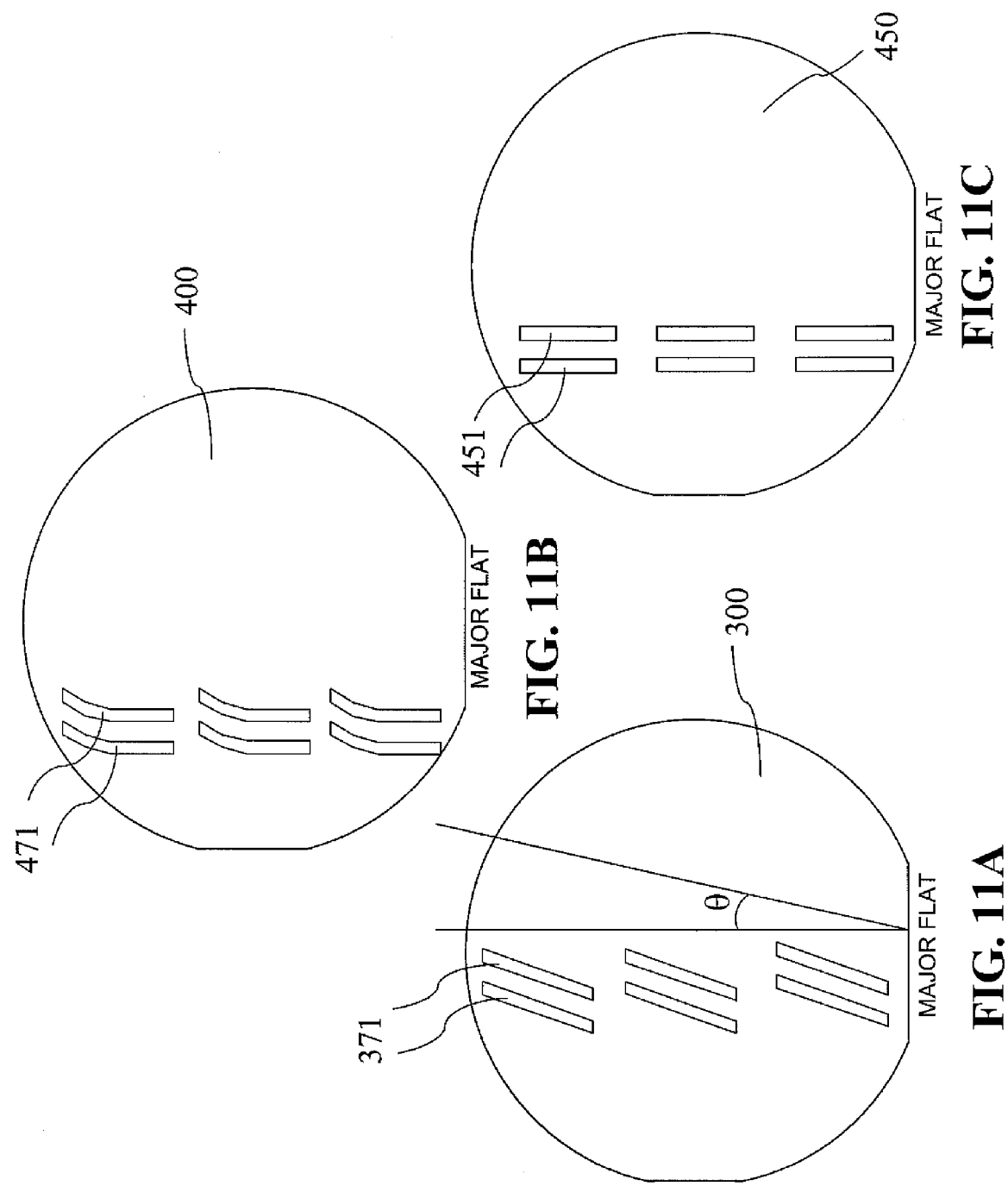

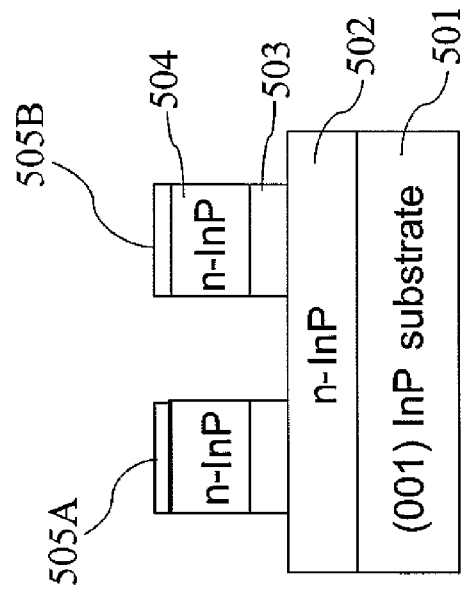
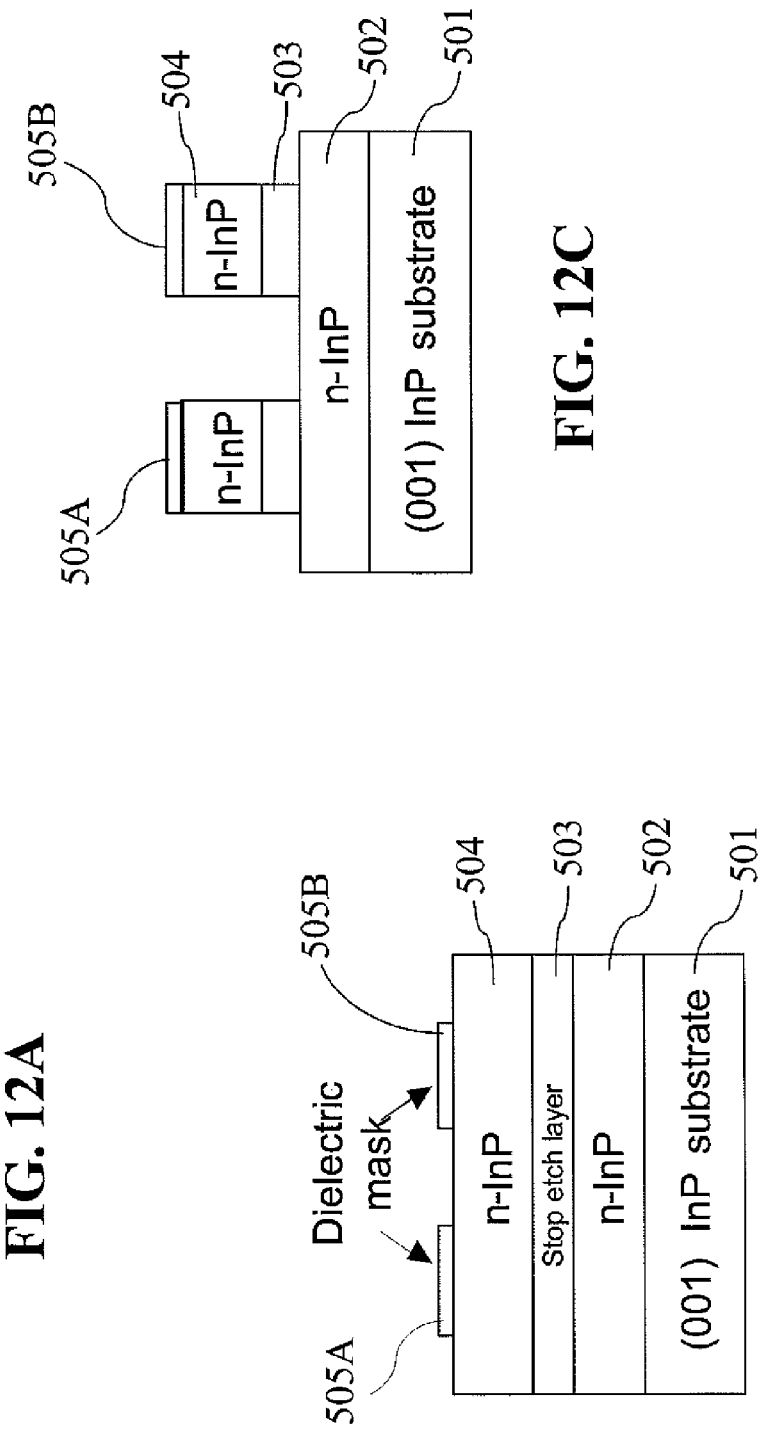
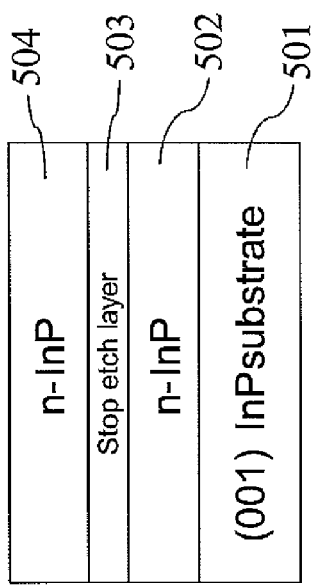

INTEGRATED PHOTONIC SEMICONDUCTOR DEVICES HAVING RIDGE STRUCTURES THAT ARE GROWN RATHER THAN ETCHED, AND METHODS FOR MAKING SAME

TECHNICAL FIELD OF THE INVENTION

The invention relates to integrated photonic semiconductor devices and methods for making such devices. More particularly, the invention relates to integrated photonic semiconductor devices such as an electroabsorption modulator (EAM) integrated with a distributed feedback laser (DFB) having a ridge structure that is grown rather than etched to enable the ridge structure to be configured to have a very precise straight, tilted or bent configuration.

BACKGROUND OF THE INVENTION

An electroabsorption modulator (EAM) is an integrated photonic semiconductor device that allows the intensity of a laser beam to be controlled via an electric voltage. The principle of operation of the modulator is based on applying an electric field to cause a change in the absorption spectrum of the laser without the applied electric field causing an excitation of carriers. A typical EAM has a waveguide and electrodes for applying an electric field in a direction that is perpendicular to the modulated light beam. In order to achieve a high extinction ratio, EAMs typically include a quantum well structure that provides an active region in which carriers are spatially confined such that movement in directions perpendicular to the layers that define the quantum well structure is prevented while movement in directions coplanar with the layer is allowed.

EAMs are capable of operating at relatively low voltages and at very high speeds (e.g., gigahertz (GHz)), which makes them useful for optical fiber communications. A distributed feedback laser (DFB) is a laser in which the entire cavity is made up of a periodic structure that functions as a distributed reflector in the wavelength range of laser action, and contains a gain medium. Typically, the periodic structure contains a phase shift in its middle and is essentially the direct concatenation of two Bragg gratings that provide internal optical gain. An EAM can be integrated with a DFB on a single chip to form an electroabsorption modulated distributed feedback laser (EML) that is capable of operating as a data transmitter.

EML assemblies that operate with low chirp in the 1550 nanometer (nm) range have been proposed for use in, for example, 10 to 40 kilometer (km) optical fiber links for 10 gigabit per second (Gb/s) data rate operations. One difficulty associated with the proposed EML assemblies is that frequency chirp due to back-reflection from the EAM end facet severely limits the propagation span at relatively high data rates (e.g., 10 Gb/s). Thus, minimizing the EAM end facet reflection is needed in order to increase the propagation span.

FIG. 1 illustrates a cross-sectional top view of a known EML assembly 2 comprising a DFB 3 and an EAM 4. The DFB 3 and the EAM 4 are each made up of p-type metal. One end facet 5 of the EML assembly 2 comprises a highly-reflective (HR) or anti-reflective (AR) coating. The other end facet 6 of the EML assembly 2 comprises an AR coating. An inter-contact isolation region 7 electrically isolates the DFB 3 and the EAM 4 from each other. The portions 8A and 8B of the DFB 3 and the EAM 4, respectively, comprise a straight reverse-mesa ridge that extends to, respectively, the end facets 5 and 6. It is the occurrence of back reflection into the EAM 4, and consequently, into the DFB 3, that is originated at the end facet 6 that degrades the performance of the EML assembly 2.

FIG. 2A illustrates a cross-sectional view of the EML assembly 2 shown in FIG. 1 along the A-A' cross-section shown in FIG. 1. The different semiconductor layers that together comprise the EML assembly 2 are as follows: an n-type (001) Indium Phosphide (InP) substrate 21 having an n-type InP buffer layer 22 formed thereon; a multi quantum well (MQW) active region 23 that is grown on top of the buffer layer 22 by a process known as Selective Area Growth (SAG); a p-type InP spacer layer 25 that is grown on top of the MQW layer 23; a p-type Indium Gallium Arsenide Phosphide (InGaAsP) etch-stop layer 26 that is grown on top of the spacer layer 25; another p-type InP spacer layer 27 that is grown on top of the InGaAsP etch-stop layer 26; a p-type InGaAsP grating layer 28 that is grown on top of the spacer layer 27; the grating layer 28 is selectively etched in the DFB portion 3 to form a periodically varying refractive index region 31 that provides a filter for the laser spectrum in a desired wavelength value; the process then continues with the re-growth of a p-type InP infill 29 and cladding layer 32; and a p-type InGaAs contact layer 33 is then grown on top of the cladding layer 32.

FIG. 2B illustrates a cross-sectional view of the DFB portion 3 of the EML assembly 2 along the E-E' cross-section shown in FIG. 2A. After the contact layer 33 is grown, a silicon oxide ($SiO_2$) dielectric mask 34 represented by mask portions 34A, 34B and 34C is deposited on the top of the contact layer 33 and a wet chemical etch process is performed to etch the contact layer 33 and the cladding and infill layers 32 and 29. FIG. 3 illustrates a top view of a wafer 38 (the (001) plane, figure not in scale) having the mask 34 shown in FIG. 2B disposed thereon, which comprises straight mask stripes 34A-34C disposed on contact layer 33.

FIG. 4 illustrates an enlarged view of the DFB portion 3 of the EML assembly 2 shown in FIGS. 2A and 2B along the E-E' cross-section shown in FIG. 2A after the chemical etching process has been performed. When the chemical etch process is performed, the device 2 etches relatively quickly in the (001) plane, but relatively slowly in the (111) plane, causing ridges 35 to be formed with lateral (111) facets 36 thereon, having an angle, $\omega$, between the (001) and (111) facets that is typically about 54.7 degrees. This ridge configuration is commonly referred to as a reverse-mesa configuration due to the fact that the top of the ridge is wider than the base of the ridge, whereas the usual understanding of a mesa is a formation having a generally flat top surface and sides that extend down to a base that is at least as large as the top surface area.

In order for the EML assembly having the reverse-mesa configuration shown in FIG. 4 to perform well, the base width Wn of the ridge structure 35 must be determined with high precision. In fact, this dimension determines, in conjunction with the grating characteristics, the spectral behaviour of the DFB 3 and the modulating properties of the EAM 4. This means that the height H (i.e., the distance from the top surface of layer 31/28 to the top surface of layer 33) and the widths, $W_A$, $W_B$ and $W_C$, of the respective mask portions 34A, 34B and 34C also must be very precise. This is especially true for the width $W_B$. Thus, the entire process comprising the growths of the infill 29, cladding 32 and contact 33 layers, the deposition of mask 34 and the wet chemical etching process must be precisely controlled. This requirement for precision is very close to or beyond the technical limits of the techniques adopted in the EML fabrication industry (i.e., growth control, film deposition kits currently available for creating masks, photolithography, wet chemical etching solutions), which leads to the ridge structures 35 having the facets 36, and consequently the width Wn, not being as precise as is necessary to provide the correct dimensions of the ridge structures needed for optimal operation of the EML device. This imprecision in the definition of the ridge structures is the main factor affecting the fabrication yield for EML assemblies of this type.

The requirement of having very low reflectivity at the EAM end facet 6 (FIG. 1) can be relaxed somewhat by forming a bent or tilted waveguide structure (i.e., a bent or tilted reverse-mesa ridge structure configuration) at the distal end portion of the EAM portion 4 adjacent to the EAM end facet 6. An attempt to make such a structure using the process described above with reference to the straight ridge configuration of FIGS. 2A-4 will be affected by the same technological difficulties previously described, i.e., the inability to precisely control the height H and width of the masks 34A-34C will lead to the wet chemical etch process producing imprecise facets 36 and imprecise width Wn (FIG. 4). Furthermore, the width $W_B$ must vary along the bent section in order to ensure that the width of the ridge structure is kept constant. This imprecision would result in poor performance of the EML assembly and, even more importantly, in a lower process yield. Consequently, it is very difficult to produce EML assemblies with straight, bent or tilted ridge structures with high yield at low cost using this process.

Dry etching techniques have been used to create ridge structures that are tilted with respect to the main crystallographic axis of the wafer. For example, U.S. Pat. No. 6,542,533 discloses the use of a dry etching technique known as reactive ion etching (RIE) to form ridge structures. However, there are problems associated with using a dry etching technique to form the ridge structures. It is difficult to control the etch depth when using dry etching, which leads to difficulties in obtaining precise and reproducible control over the etch depth. In addition, dry etching typically leads to the ridge structure having a rectangular shape. When there are limits on the ridge width, such as in cases where monomodal propagation is required, the rectangular shape makes it difficult to achieve low serial resistance in the device. Another problem is that dry etching results in crystal damage and passivation of p-type doping species, which makes it necessary to perform an annealing process after the etching process has been performed. In addition, performing the annealing process does not lead to a complete recovery from the crystal damage and passivation.

Accordingly, a need exists for a way to create EML assemblies having straight ridge structures that are more precisely formed in order to provide improved performance and higher manufacturing yield. A need also exists for a way to create EML assemblies and other devices with bent or tilted ridge structures to reduce the requirement of low reflectivity at the EAM end facet, thereby providing improved performance and higher manufacturing yield.

SUMMARY OF THE INVENTION

The invention provides photonic semiconductor devices having ridge structures that are grown using a SAG technique, and methods for making such devices. The employment of the SAG technique results in the formation of a ridge structure that has a very precise configuration. The use of this process enables straight, bent and tilted ridge structures to be formed with higher precision than that which is obtainable using the known wet chemical etching techniques. In addition, a lesser number of processing steps are required to create the photonic device than in the known process in which the ridge structures are obtained by chemical etching The high precision of the ridge structure and the lesser number of processing steps needed to create the device increase manufacturing yield and allow the overall cost of the device to be reduced.

These and other features and advantages of the inventions will become apparent from the following description, drawings and claims.

BRIEF DESCRIPTION OF THE DRAWINGS

FIGS. 11A, 11B and 11C illustrate top views of three wafers having, respectively, tilted,bent and straight mask stripes disposed thereon for growing tilted, bent and straight ridges, respectively.

FIGS. 12A-12C represent the process steps and materials that are used to create a pre-patterned substrate.

DETAILED DESCRIPTION OF ILLUSTRATIVE EMBODIMENTS

Figure 1:
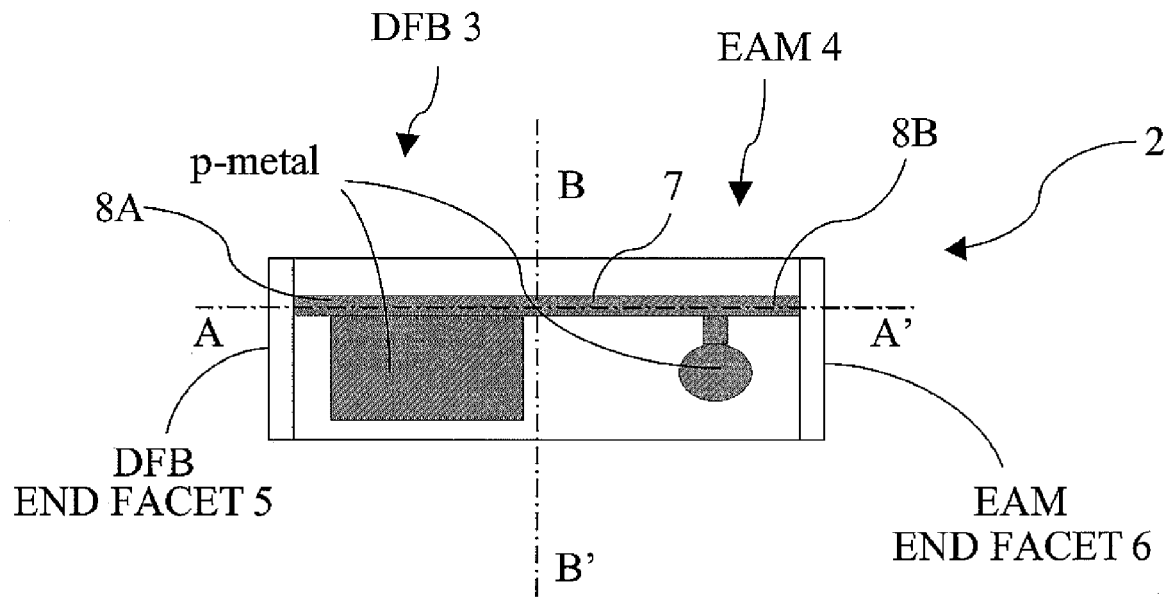
FIG. 1 illustrates a cross-sectional top view of a known EML assembly comprising a DFB and an EAM.
Figure 2A:
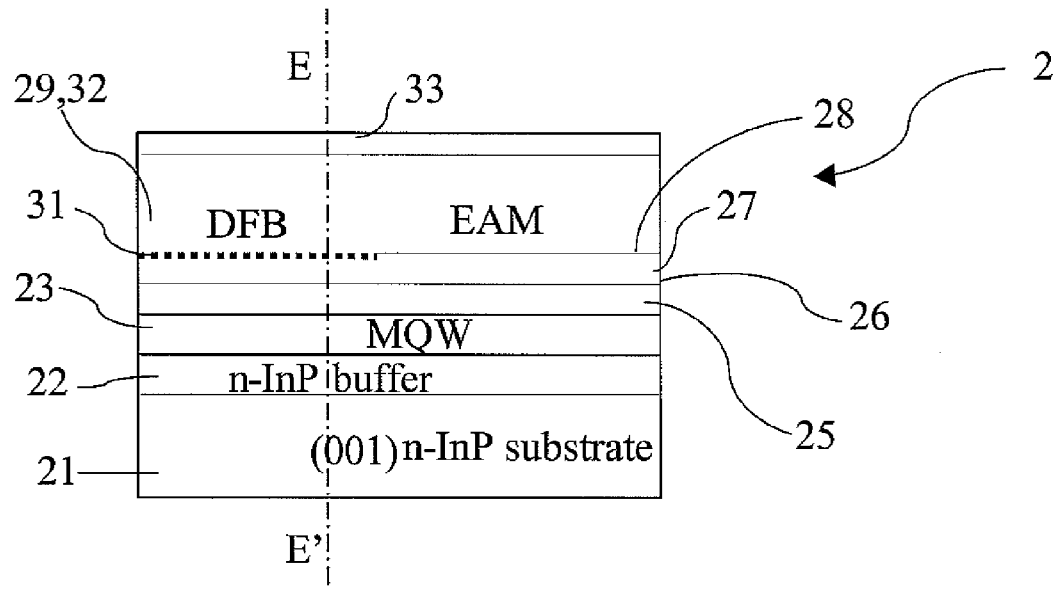
FIG. 2A illustrates a cross-sectional view of the EML assembly shown in FIG. 1 along the A-A' cross-section shown in FIG. 1.
Figure 2B:
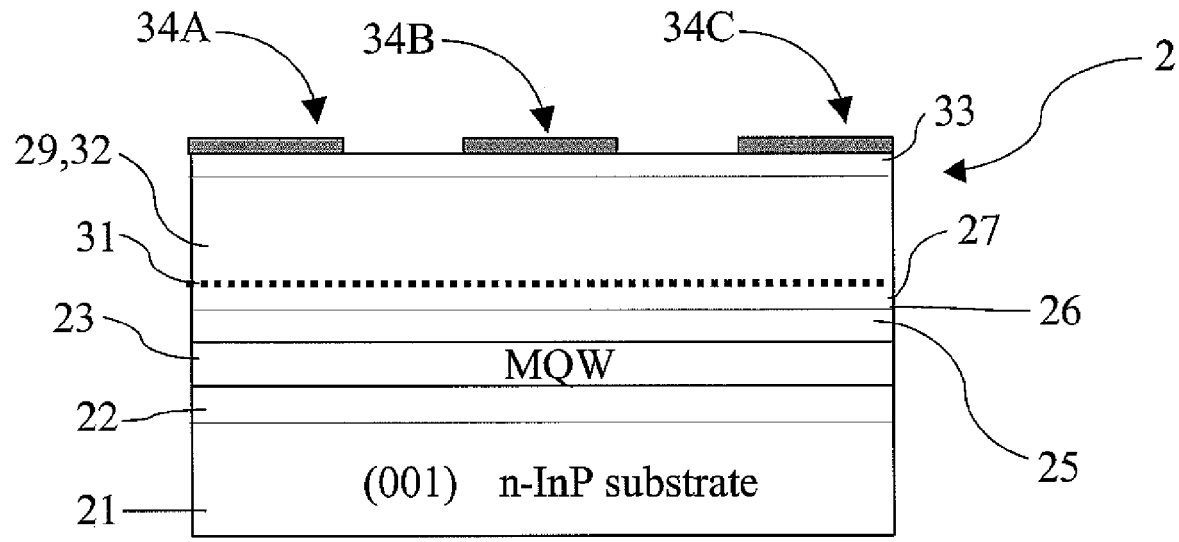
FIG. 2B illustrates a cross-sectional view of the DFB portion of the EML assembly shown in FIG. 1 along the E-E' cross-section shown in FIG. 2A, with SiO2 stripes deposited thereon.
Figure 3:
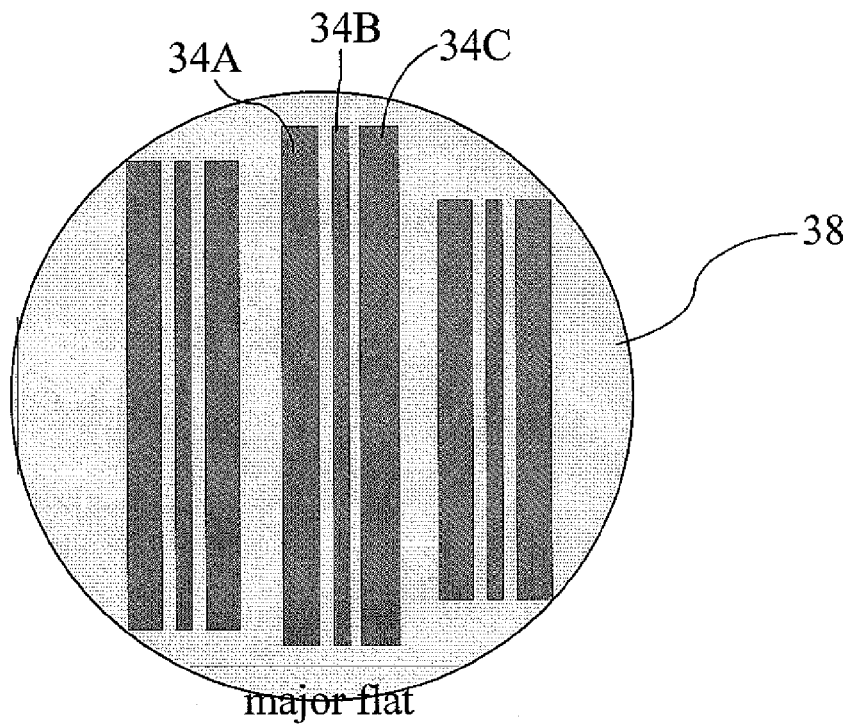
FIG. 3 illustrates a top view of a wafer in the (001) crystallographic plane having the mask shown in FIG. 2B disposed thereon.
Figure 4:
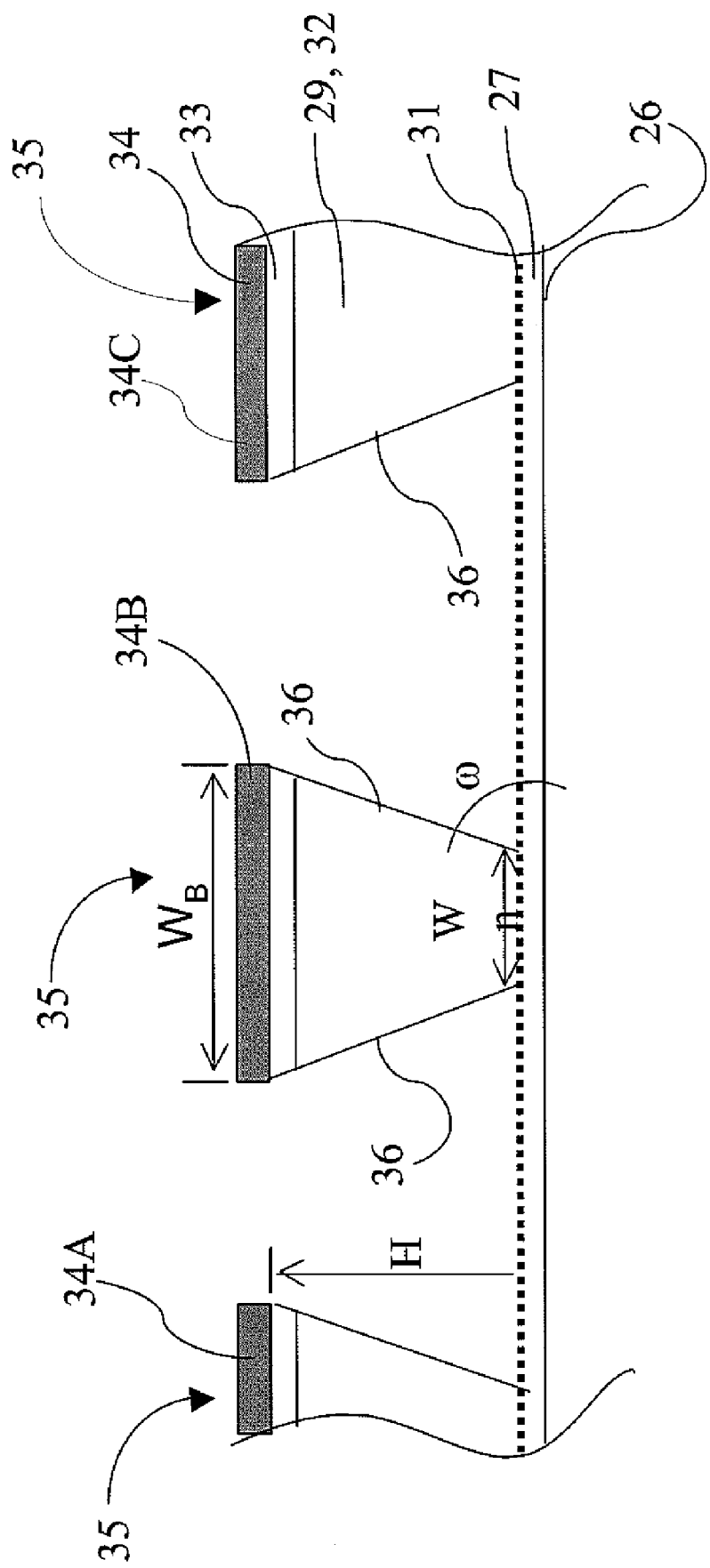
FIG. 4 illustrates an enlarged view of the DFB portion of the EML assembly shown in FIGS. 2A and 2B along the E-E' cross-section shown in FIG. 2A after the chemical etching process has been performed.

As described above, the wet chemical etch process that is typically used to create the reverse-mesa ridge structure in known EML assemblies is very difficult to control, especially in cases in which a bent or tilt ridge structure is required or desired in order to decrease the reflectivity of the EAM end facet. In accordance with an embodiment, a SAG technique is used to create the ridge structure. This process causes a self-assembled and self-aligned ridge structure to be formed that has a very precise configuration. The use of this process enables straight, bent and tilted ridge structures to be formed with high precision, which leads to improvements in manufacturing yield and better performance of the EML assemblies. In addition, because the ridge structure is self-assembled and self-aligned, fewer technological steps are required in comparison with the known approach described above with reference to FIGS. 2A-4. This reduction in the number of technologic steps used in the fabrication process increases manufacturing yield and allows the overall cost of the device to be reduced.

Although it is known to use the SAG approach in the realization of discrete III-V semiconductor lasers, it is not known to use the SAG technique to create a straight, bent or tilted ridge structure in an integrated EML assembly. For example, NEC Compound Conductor Devices of Kawasaki, Japan applied the micro-SAG technique in the fabrication of single-mode Al-based laser devices. In this case, an n-doped (001) InP substrate was coated with a $SiO_2$ film, which was subsequently patterned into mask stripes aligned along the [110] InP crystal direction. This was followed by an epitaxial growth process during which a trapezoidal mesa with {111} sidewalls resulted. The sidewalls were very smooth, and the lateral width was easily adjustable to realize a single mode waveguide. Thus, the use of micro-SAG in this case resulted in a "self-assembled" Aluminum (Al)-based laser device in a single growth step. This process is disclosed in U.S. Pat. No. 6,828,589, which is incorporated herein by reference. NEC has also applied the micro-SAG technique to identify growth conditions that led to the selective growth of an AlInGaAs waveguide buried in p-type InP in a single epitaxy step. This is disclosed in U.S. Pat. No. 5,659,565, which is also incorporated herein by reference.

In accordance with an embodiment of the invention, the MQW active region is not grown in the same SAG process that leads to the ridge structure. Rather, the MQW active region is pre-grown by SAG on a pre-patterned substrate resulting in a wide nearly-planar structure. Subsequently, the cladding and contact layers are grown only on a narrow region on the top of the MQW structure using the SAG technique in order to realize the self-assembled and self-aligned ridge structure of the EML assembly.

While the concepts and principles described below apply equally to all III-V semiconductor-based devices, for ease of illustration and discussion, the principles and concepts will be described only with reference to an Al-based EML assembly. Those skilled in the art will understand, in view of the description provided herein, the manner in which these principles and concepts can be applied to all III-V semiconductor-based devices. Also, although these principles and concepts are being described with reference to EML assemblies, those skilled in the art will understand, in view of the description provided herein, the manner in which the principles and concepts can be applied to other types of photonic devices.

Figure 5:
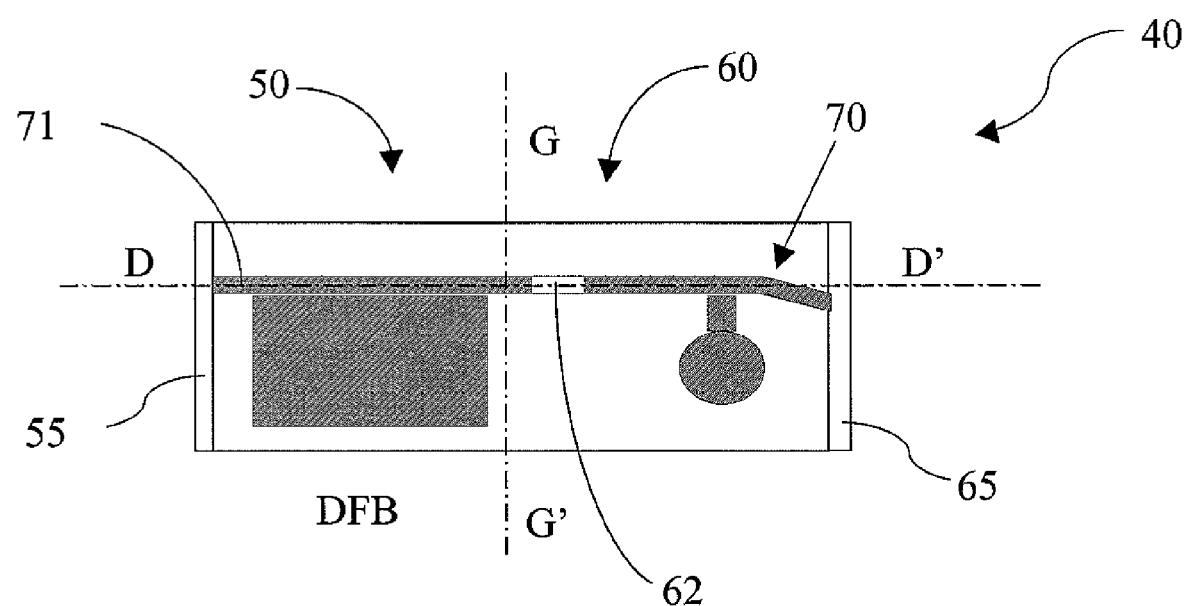
FIG. 5 illustrates a top view of the EML assembly in accordance with an embodiment in which the SAG technique is used to create a bent waveguide structure that provides the EML assembly with very good performance.

FIG. 5 illustrates a top view of the EML assembly 40 in accordance with an embodiment in which the SAG technique is used to create a bent waveguide structure that provides the EML assembly 40 with very good performance. The EML assembly 40 comprises a DFB 50 and an EAM 60. An inter-contact isolation region 62 electrically isolates the DFB 50 and the EAM 60 from each other. The DFB 50 and the EAM 60 are each made up of p-type metal. The end facet 55 of the DFB 50 comprises a HR or AR coating. The end facet 65 of the EAM 60 comprises an AR coating. The distal end of the EAM 60 adjacent the end facet 65 comprises a bent waveguide structure 70. This bent waveguide structure 70 is formed, together with the straight ridge 71 of the DFB 50 and the inter contact isolation 62, by using the SAG technique in the manner described below with reference to FIGS. 6-12. As described below, using the SAG technique to create the ridge structures results in a precisely formed ridge structure. This gives the EML assembly 40 very good performance and manufacturability characteristics.

Figure 6A:
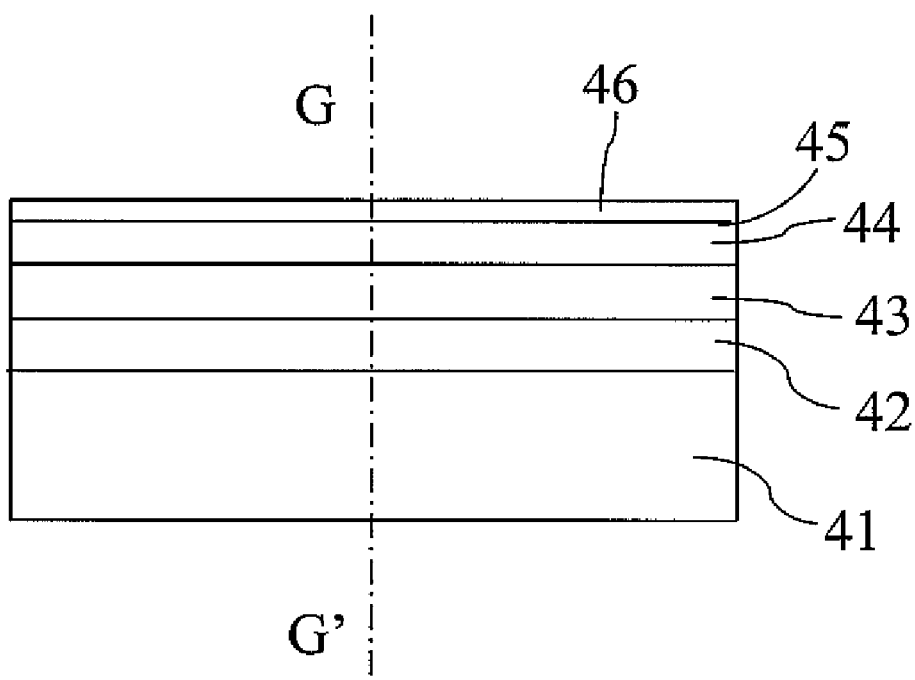
FIG. 6A illustrates a cross-sectional view of the EML assembly shown in FIG. 5 along the D-D' cross-section shown in FIG. 5.

FIG. 6A illustrates a cross-sectional view of the EML assembly 40 shown in FIG. 5 along the D-D' cross-section up to the cap layer 46. The steps used to fabricate the EML assembly 40 are similar to those described above with reference to FIG. 2A up until the grating layer has been etched. The steps in accordance with an embodiment are as follows. An n-type (001) Indium Phosphide (InP) substrate 41 having an n-type InP buffer layer 42 formed thereon is provided. On top of the buffer layer 42, a MQW active region 43 is then grown followed by growth of a p-type InP spacer layer 44, a p-type InGaAsP grating layer 45 and a p-type InP cap layer 46, all formed by conventional SAG.

Figure 6B:
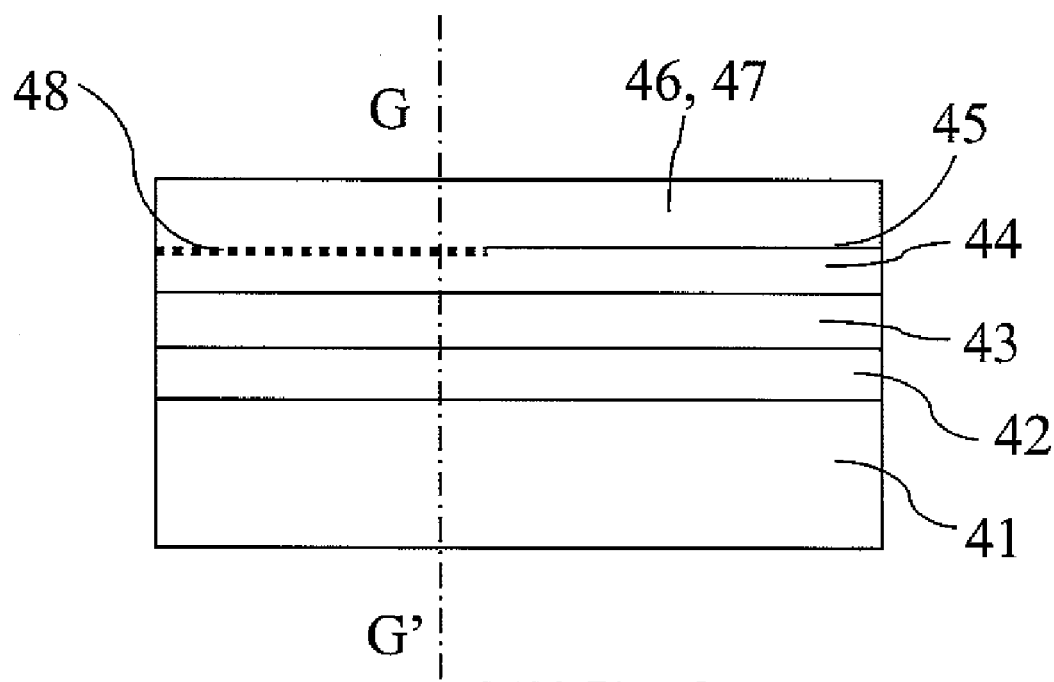
FIG. 6B illustrates a cross-sectional view of the EML assembly shown in FIG. 5 along the D-D' cross-section shown in FIG. 5 after the grating layer has been selectively etched in the DFB portion.

FIG. 6B illustrates a cross-sectional view of the EML assembly 40 shown in FIG. 5 along the D-D' cross-section after the cap layer 46 and grating layer 45 have been selectively etched in the DFB portion 50. The grating 45 is realized on the DFB section using suitable techniques, such as electron beam lithography (EBL) combined with reactive ion etching (RIE), to form a periodically varying refractive index region 48 that provides a spectrum filter for DFB operation in a desired wavelength value. The process then continues with the further growth of the p-type InP infill layer 47. It should be noted that the combination of the layers 41-48 is only an example of a suitable composition for the EML assembly 40. Other layers may be used instead, and layers may be added to or deleted from the combination of layers 41-48 shown in FIGS. 6A and 6B.

Figure 6C:
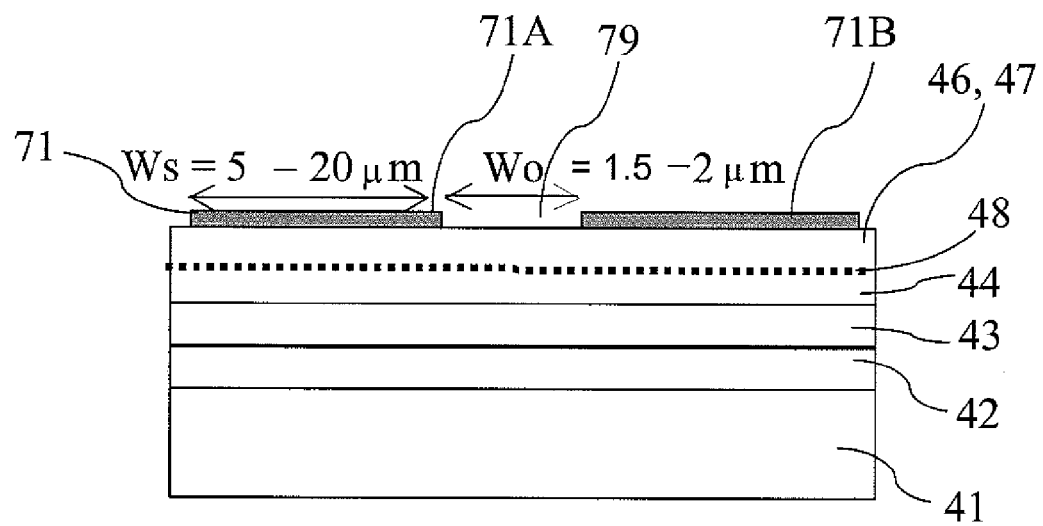
FIG. 6C illustrates a cross-sectional view of the DFB portion of the EML assembly shown in FIG. 5 along the G-G' cross-section shown in FIGS. 6A and 6B, with a pair of SiO2 stripes deposited thereon.

FIG. 6C illustrates a cross-sectional view of the DFB portion 50 of the EML assembly 40 shown in FIG. 5 along the G-G' cross-section shown in FIGS. 6A and 6B. After the infill layer 47 has been grown, a mask 71 made of a dielectric material such as SiO$_2$, for example, is placed on top of the infill layer 47 along the [110] crystal direction. This is typically performed using a conventional photolithographic technique. The mask 71 is made up of a series of mask pairs, only one of which is shown in FIG. 6C. The pair shown comprises mask stripes 71A and 71B. The SAG technique adopted in the realization of the ridge structure is generally based on the concepts of the standard SAG technique, but in this embodiment, the opening 79 between the pair of stripes is much smaller than when a standard SAG technique is used, and is typically on the order of between about 1.5 to 2.0 micrometers (microns).

The invention is not limited with respect to the dimensions of the stripes 71A and 71B or the spacing between the stripe pairs. In principle, any shape, size and combination of stripes can be used. In practice, however, the shape, size and combination of stripes tend to be dictated by the need for the device to function properly. In this illustrative embodiment, the thickness of each stripe 71A and 71B is between about 0.1 microns and 1.0 microns. The width, $W_s$, of the stripes 71A and 71B typically ranges from about 5.0 microns to about 20.0 microns. The width, Wo, of the opening 79 typically ranges from about 1.5 micrometers to about 2.0 micrometers.

Figure 7:
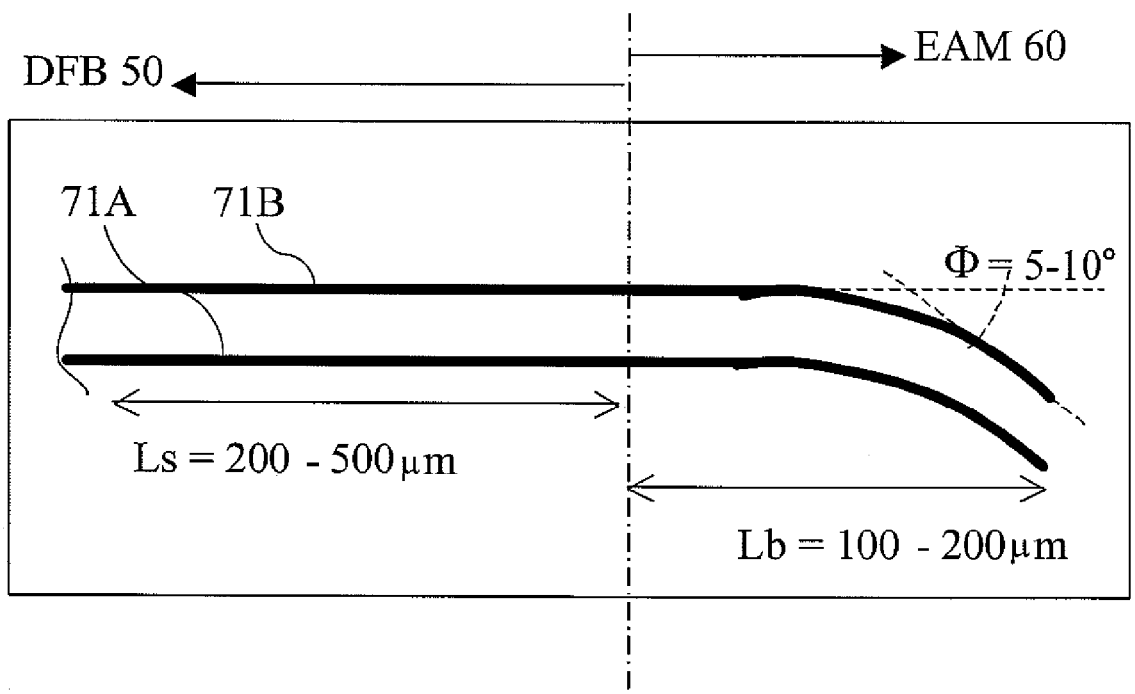
FIG. 7 illustrates a top view of the dielectric mask shown in FIGS. 6C extending over the top surface of the infill layer from the end facet of the DFB to the end facet of the EAM.
Figure 8:
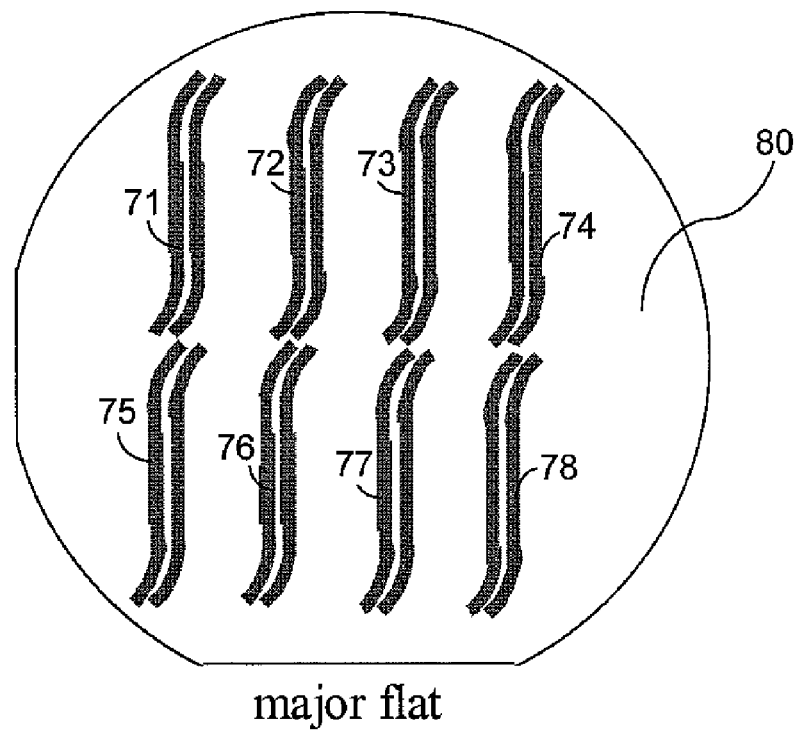
FIG. 8 illustrates a top view of a wafer having several pairs of mask stripes deposited thereon.

FIG. 7 illustrates a top view (not to scale) of the dielectric mask 71 extending over the top surface of the infill layer 47 and defining the area of the DFB 50 and that of the EAM 60. The length of the stripes in the DFB 50, Ls, typically ranges from about 200 microns to about 500 microns. The length of the stripes in the EAM 60, Lb, typically ranges from about 100 microns to about 200 microns, and the stripes have a bend angle, Φ, which is typically between 5° and 12°. FIG. 8 illustrates a top view of a wafer 80 having eight pairs 71-78 of mask stripes (not to scale) deposited thereon. The spacing between pairs of stripes typically ranges from about 200 microns to about 300 microns.

Figure 9A:
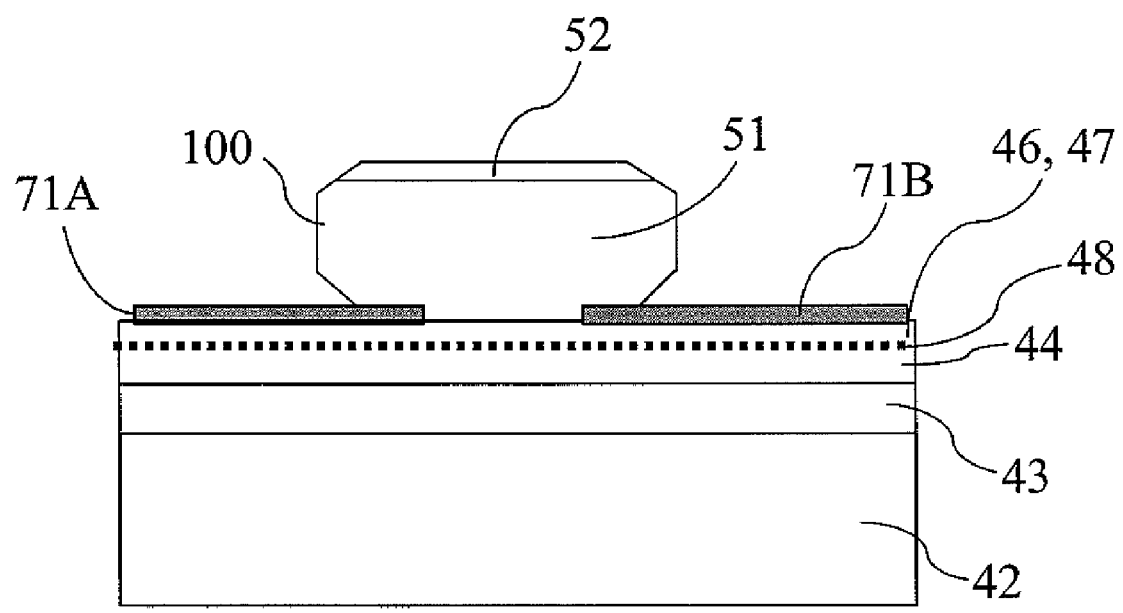
FIG. 9A illustrates a cross-sectional enlarged view of the DFB portion shown in FIG. 5 along the G-G' cross-section from the buffer layer up after the mask has been deposited and the cladding and contact layers, respectively, have been grown using the SAG technique.
Figure 9B:
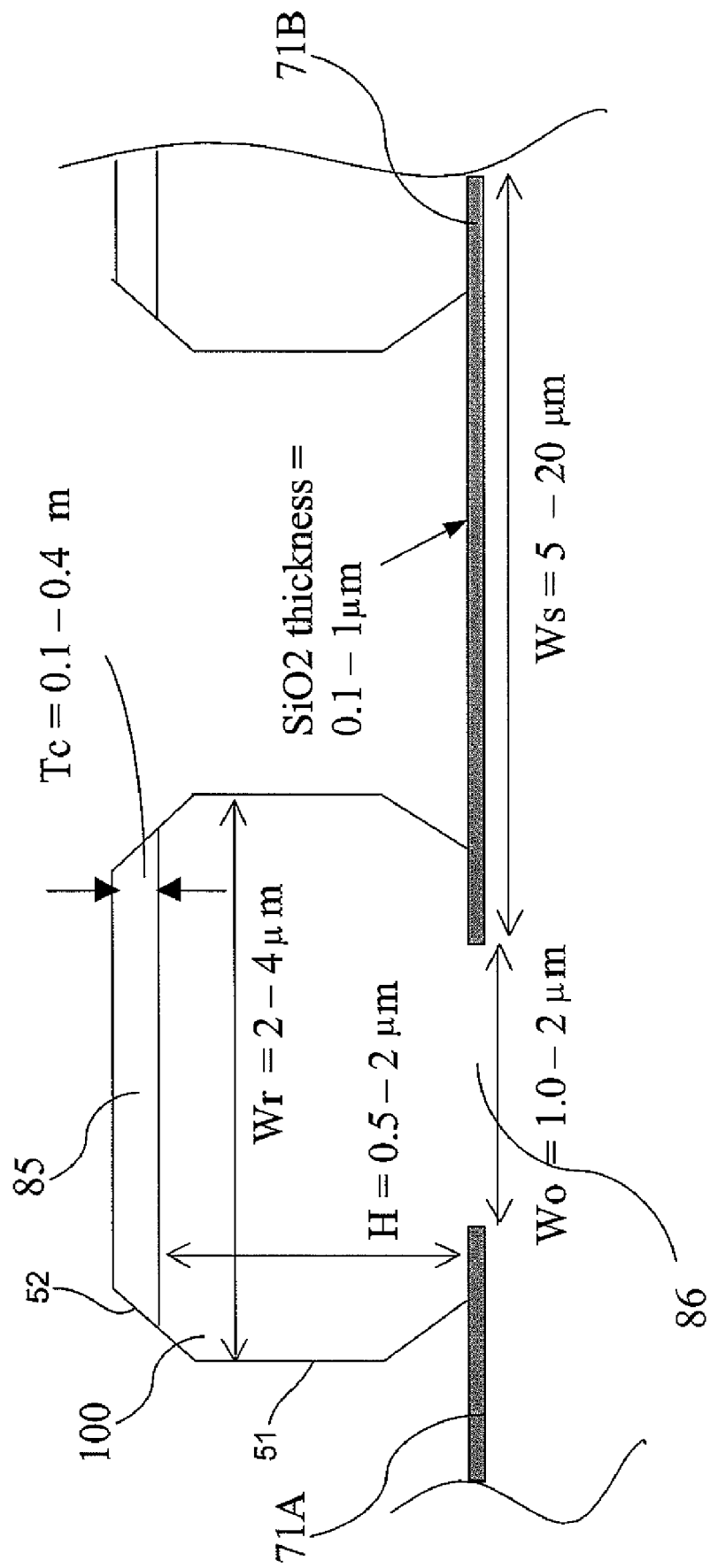
FIG. 9B illustrates a cross-sectional enlarged view of the DFB portion shown in FIG. 9A where the cladding layer is shown to extend vertically and laterally relative to the opening between the mask stripes.

FIG. 9A illustrates a cross-sectional enlarged view of the DFB portion 50 shown in FIG. 5 along the G-G' cross-section from the buffer layer 42 up after the mask has been deposited and the cladding and contact layers 51 and 52, respectively, have been grown using the SAG technique. FIG. 9B illustrates a cross-sectional enlarged view of the DFB portion 50 shown in FIG. 9A in which the cladding layer 51 is shown to extend vertically and laterally relative to the opening between the mask stripes 71A and 71B. The cladding layer 51 is p-type InP and the contact layer 52 is p-type InGaAs. The growth of the cladding and contact layers 51 and 52 results in the formation of a ridge structure comprising self-aligned and self-assembled ridges 100 surrounded by a series of planes with characteristics that depend on the particular growth conditions used. Thus, the particular shape and dimensions of the ridges 100 depend on the growth conditions selected and are not limited to any particular shape or dimensions.

For the purpose of providing an example of a ridge structure that is suitable for use in an EML assembly and other photonic semiconductor devices, particular dimensions for the ridges 100 will now be described with reference to FIG. 9B. The height, H, of the ridge 100 should be a minimum of from about 0.5 to about 2.0 microns. The height H corresponds to the distance from the top surface of the mask stripes 71A-71B to the bottom surface of the contact layer 52. The thickness, $T_c$, of the contact layer 52 should be from about 0.1 to about 0.4 microns. The width, $W_r$, of the ridge 100 is determined by the selected shape for the ridge and by the height, H. Typical values for $W_r$ range from about 2.0 to 4.0 microns. The thickness, Tm, of the mask stripes 71A-71B typically ranges from about 0.1 to 1.0 microns. The width of the opening, $W_o$, between the mask stripes 71A and 71B typically ranges from about 1 to 2.0 microns. The width, $W_s$, of the stripes 71A and 71B typically ranges from about 5.0 to about 20.0 microns. By providing ridges with the generally trapezoidal shape depicted in FIG. 9B, the width Wr can be made relatively wide, which means that the width of the contact region 85 is also relatively wide.

Figure 10:
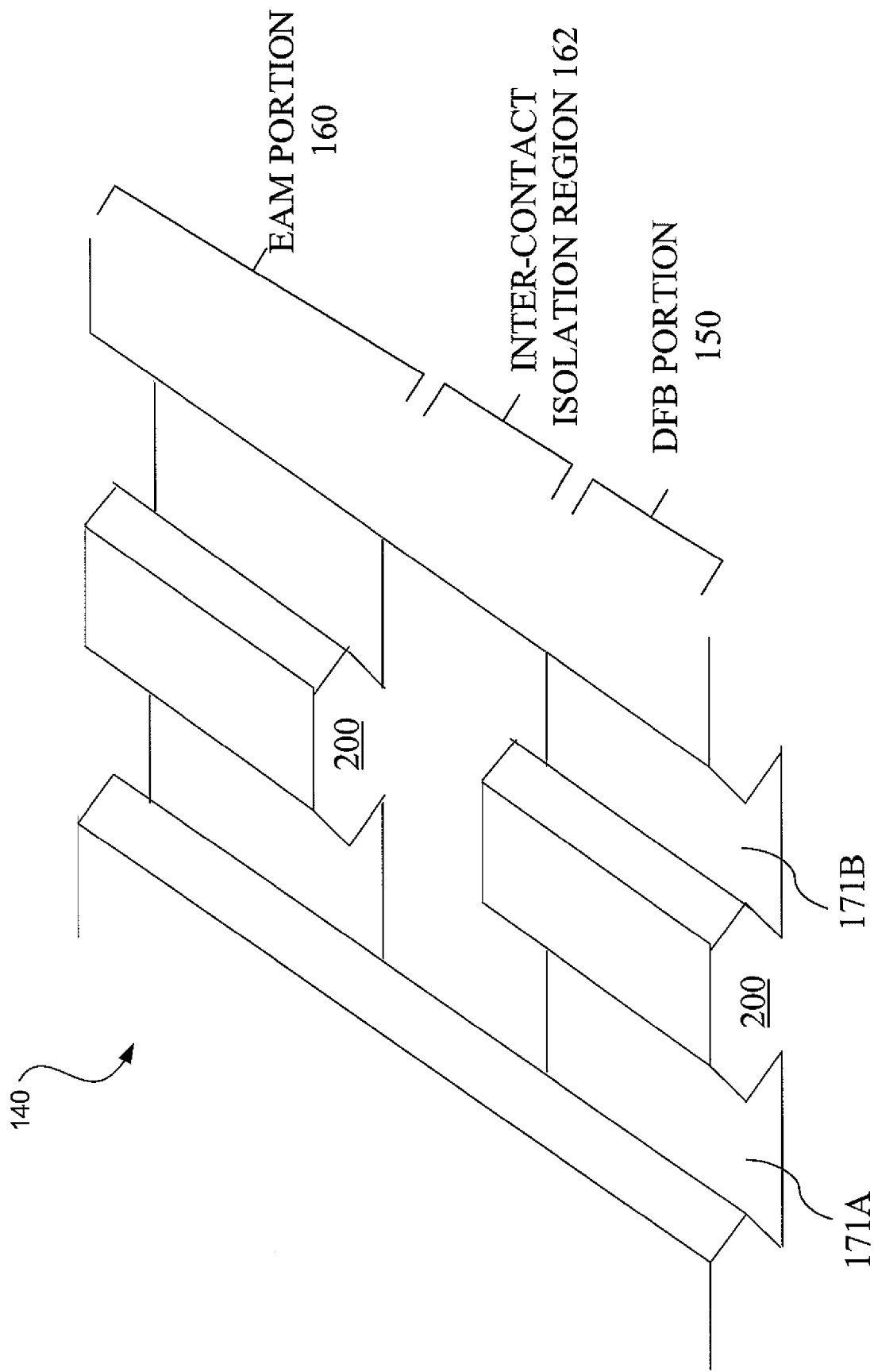
FIG. 10 illustrates a portion of one of the ridges along the same section represented by FIG. 9B, but from a slightly perspective view.

One advantage of this approach over the standard approach of obtaining the ridge by wet chemical etching is that the base width of the ridge 86 is determined only by the value of the width of the opening Wo, which is well controlled by the standard photolithography technique adopted in the definition of the mask stripes 71A and 71B. The result is improved manufacturability of the EML device, as well as improved performance. FIG. 10 illustrates a top perspective view of an EML assembly 140 in accordance with an embodiment in which the ridges 200 are straight rather than bent or tilted. The regions 171A and 171B correspond to the mask stripes that prevent growth of the cladding and contact layers. The EML assembly 140 comprises a DFB portion 150, an EAM portion 160 and an inter-contact isolation region 162. The EAM and DFB end facets are not shown in FIG. 10. The inter-contact isolation region 162 is created by masking that region off with the same dielectric mask layer that is used to form the mask stripes 171A and 171B. With the wet and dry etching techniques described above with reference to FIGS. 1-4, the inter-contact region 7 (FIG. 1) is created by the dry or wet etching technique that is used. By creating the isolation region 162 shown in FIG. 10 through preventing growth rather than etching, one or more steps of the process used to create the EAM assembly 2 shown in FIG. 1 are eliminated. In addition, the resulting increased inter-contact resistance between the DFB 150 and EAM 160 portions provides the EML assembly 140 with improved performance and lower power consumption characteristics.

FIGS. 11A, 11B and 11C depict different orientations and combinations of stripes in the realization of the self assembled and aligned ridge structures produced by SAG. FIG. 11A illustrates a top view of wafer 300 having tilted mask stripes 371 disposed thereon for growing tilted ridges. The mask stripes 371 are tilted with respect to the main crystallographic axis <110> of the wafer 300 by some angle, θ. This angle will typically range from about 5° to about 12°. FIG. 11B illustrates a top view of a wafer 400, wherein the stripes 471 are those described above with reference to FIGS. 5-8. The mask stripes 471 are disposed along the main crystallographic directions <110> of wafer 400 and the distal end portion relative to the EAM region 60 (FIG. 7) is adiabatically curved by some amount Φ. FIG. 11C illustrates a top view of a wafer 450, wherein the stripes 451 are those described above with reference to FIGS. 1-4 and used in the typical process to form straight ridges. The mask stripes 451 are normally disposed parallel to the main crystallographic axis <110> of the wafer to exploit the normal cleavage of the wafer. In general, the tilt or bend angles can have any desired values, and bent, tilted and/or straight ridge structures can be combined if desired.

The process that may be used to create an EML assembly having a tilted ridge structure grown via a SAG process using the titled mask stripes shown in FIG. 11A will now be described with reference to FIGS. 12A-16. In addition, the EML assembly that will now be described also includes a tilted diffractive Bragg grating that is buried beneath the ridge structure. FIGS. 12A-12C represent examples of process steps and materials that may be used to create an EML assembly having a tilted ridge structure. The process is similar to the process described above with reference to FIGS. 6A-9B, but with some variations to provide an optical waveguide structure that is tilted rather than bent, as will now be described.

FIGS. 12A-12C represent the process steps and materials that are used to create a pre-patterned substrate. With reference to FIG. 12A, two n-type InP buffer layers 502 and 504 are epitaxially grown on a wafer such as that shown in FIG. 11A comprising a III-V substrate 501, such as an n-type (001) InP substrate, for example. A stop etch layer 503 is included to enable the results of subsequent etching processes to be precisely controlled. As shown in FIG. 12B, a dielectric mask 505 is then deposited on top of buffer layer 504 and patterned to create tilted mask stripes 505A and 505B. The mask portions 505A and 505B are tilted by an angle, θ, with respect to the main crystallographic axis <110> of the wafer, as already described above with reference to FIG. 11A. The upper epitaxial and stop etch layers 503 and 504 are then chemically etched, leaving a recess for subsequent SAG growth, as shown in FIG. 12C. The resulting structure shown in FIG. 12C will be referred to herein as a pre-SAG buffer, or, alternatively, as a pre-patterned substrate.

Figure 13:
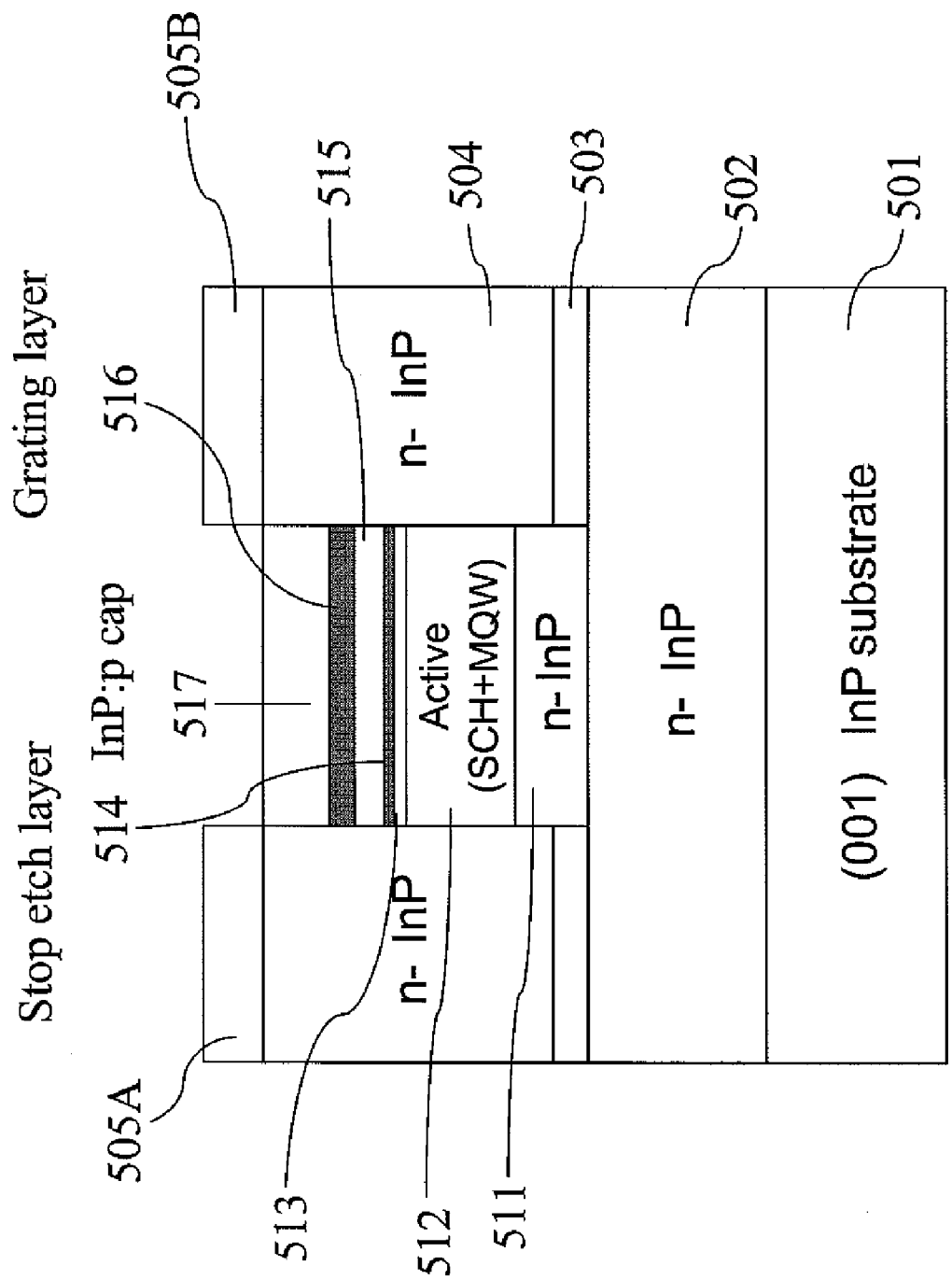
FIG. 13 illustrates the pre-SAG buffer shown in FIG. 12C after the MQW active region and other layers have been grown using SAG.

FIG. 13 illustrates the MQW active region and other layers that have been grown by SAG on the pre-SAG buffer shown in FIG. 12C. First, an n-type InP layer 511 is deposited on the top of layer 502 in the unmasked regions. The MQW active region layer 512 is then grown embedded between two high energy gap separate confinement heterostructure (SCH) layers of n-type AlGaInAs. A p-type InP spacer layer 513 is then grown followed by a stop etch layer 514. Another p-type InP spacer layer 515 is then grown on top of layer 514. A layer 516 of intermediate energy gap material (e.g., AlGaAsP or AlGaInAs) is then grown, which will be used to create a diffractive Bragg grating (DBG). A cap layer 517 of p-type InP is then grown on top of layer 516.

Thus, the conventional approach described above with reference to FIGS. 2A-4 and also that described with reference to FIGS. 5-10, can be improved by employing the pre-SAG buffer shown in FIG. 12C, which leads to the advantage of the active MQW structure being grown in a recess. As a result, it is possible to grow a thick buffer layer, with beneficial effects on the crystallographic quality of the grown material. Furthermore, a quasi-planar post-SAG growth is obtained that makes the process of making the final device easier, thereby facilitating the manufacture of the final device.

Figure 14:
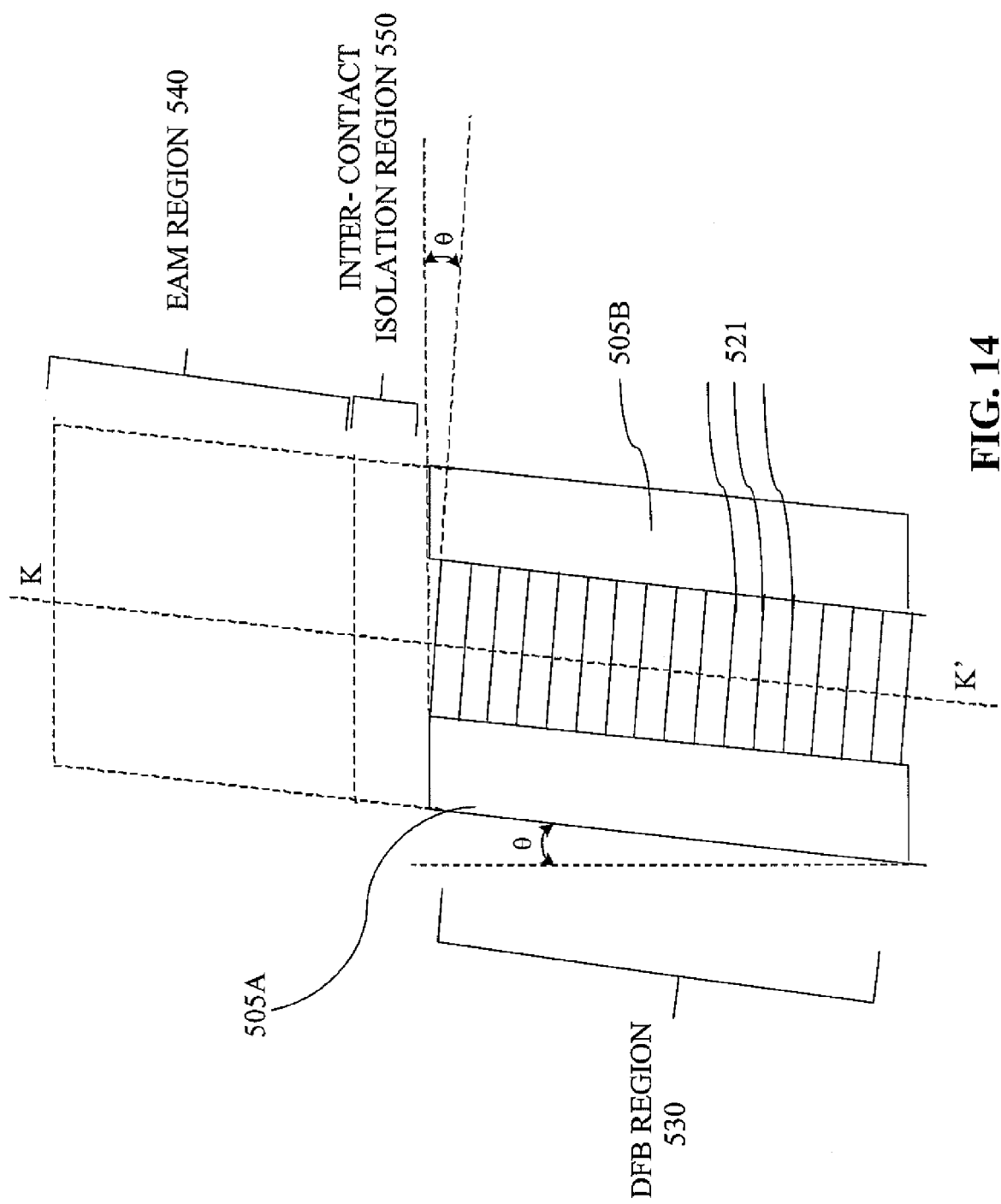
FIG. 14 illustrates a top view of the device shown in FIG. 13 after the grating has been formed.

FIG. 14 illustrates a top view of the device shown in FIG. 13 after the dielectric mask stripes 505A and 505B have been removed and the grating has been formed in layers 516 and 517 on the DFB region 530, using the same techniques described above for the bent case. As shown in FIG. 14, the grating has a corrugation represented by lines 521 that is oriented at the same tilt angle θ as the angle of the mask stripes 505A and 505B. The corrugation 521 is exactly perpendicular to the laser waveguide. After the grating has been defined, the re-growth of approximately 0.5 microns of a p-type InP infill (518, FIG. 17) is performed. A second dielectric deposition and patterning is then performed leaving dielectric masking only in the isolation region 550 between the DFB area 530 and the EAM area 540. The separation width of this mask lies in a range of about 50 to about 100 microns.

Figure 15:
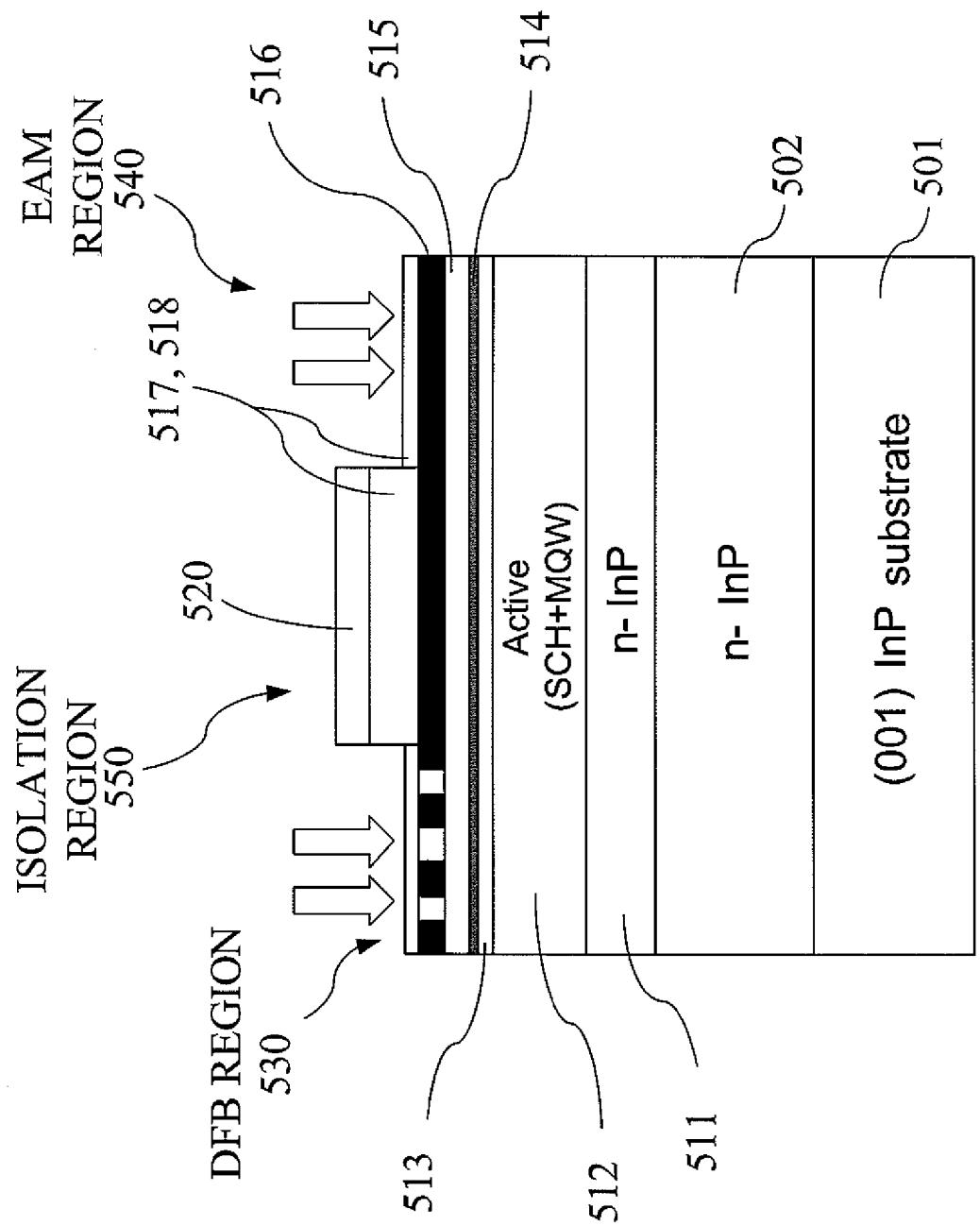
FIG. 15 illustrates the K-K' cross section of the device shown in FIG. 14 after the masks 505A and 505B has been removed and another mask 520 has been deposited over the inter-contact isolation region.

FIG. 15 illustrates the cross-section K-K' of FIG. 14 where this isolation mask 520 can be seen. The exposed sides of the DFB 530 and EAM 540 are then partially etched via wet or dry etching to partially remove the p-type infill 518 to meet thickness requirements in the DFB and EAM regions. The deposition of the dielectric mask 520 in the separation region 550 has the effect of inhibiting the growth in this area during the subsequent narrow-SAG process that defines the ridge structure. This provides the electrical separation between the DFB and EAM regions without resorting to the conventional post etch steps as is required in the process described above with reference to FIGS. 2A-4. The following operation is the deposition of tilted dielectric SAG stripes over the DBF and EAM sections.

Figure 16:
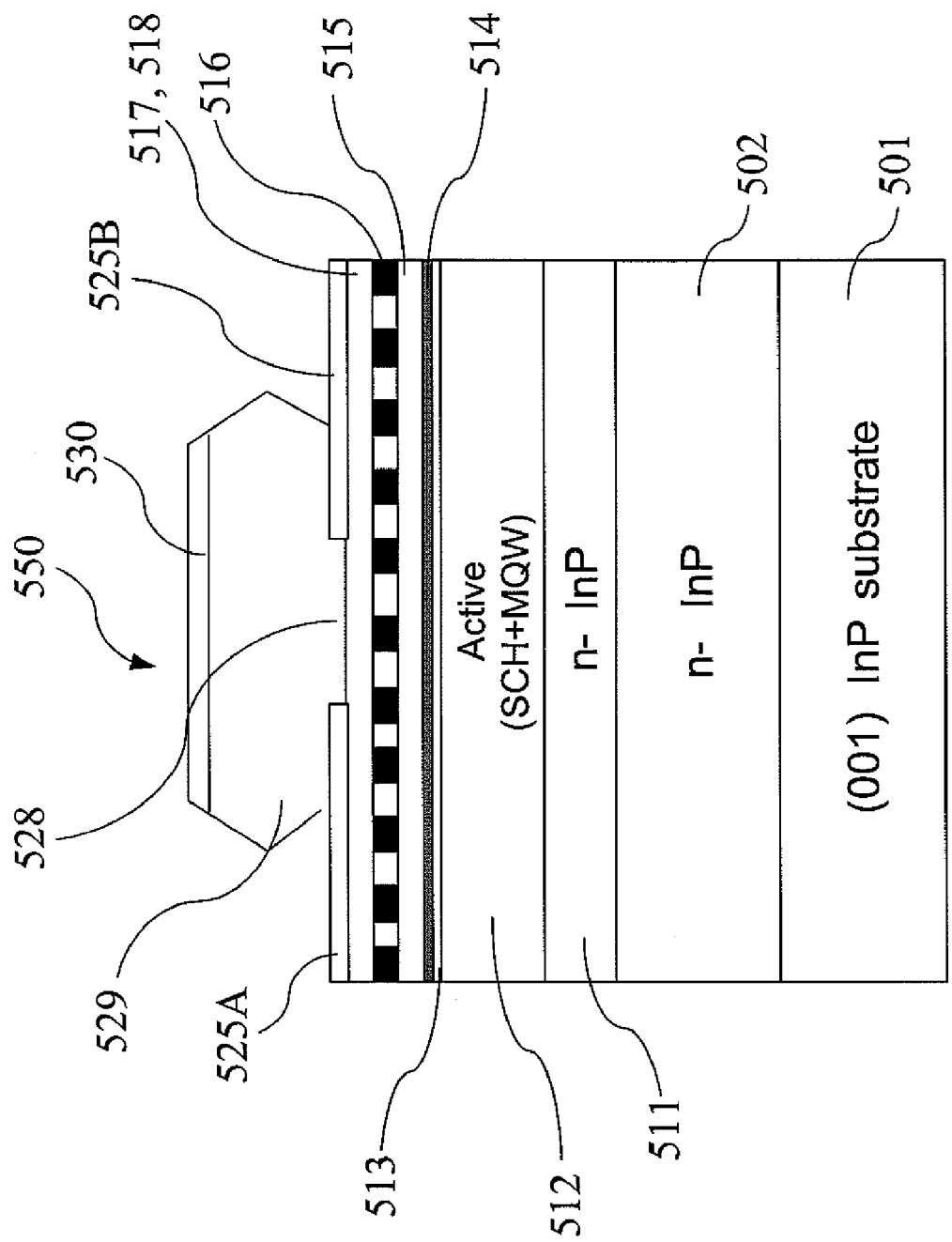
FIG. 16 illustrates a side view of a cross-section of the DFB portion of the device shown in FIG. 15 after SAG growth has occurred to create the tilted ridge structure.
Figure 17:
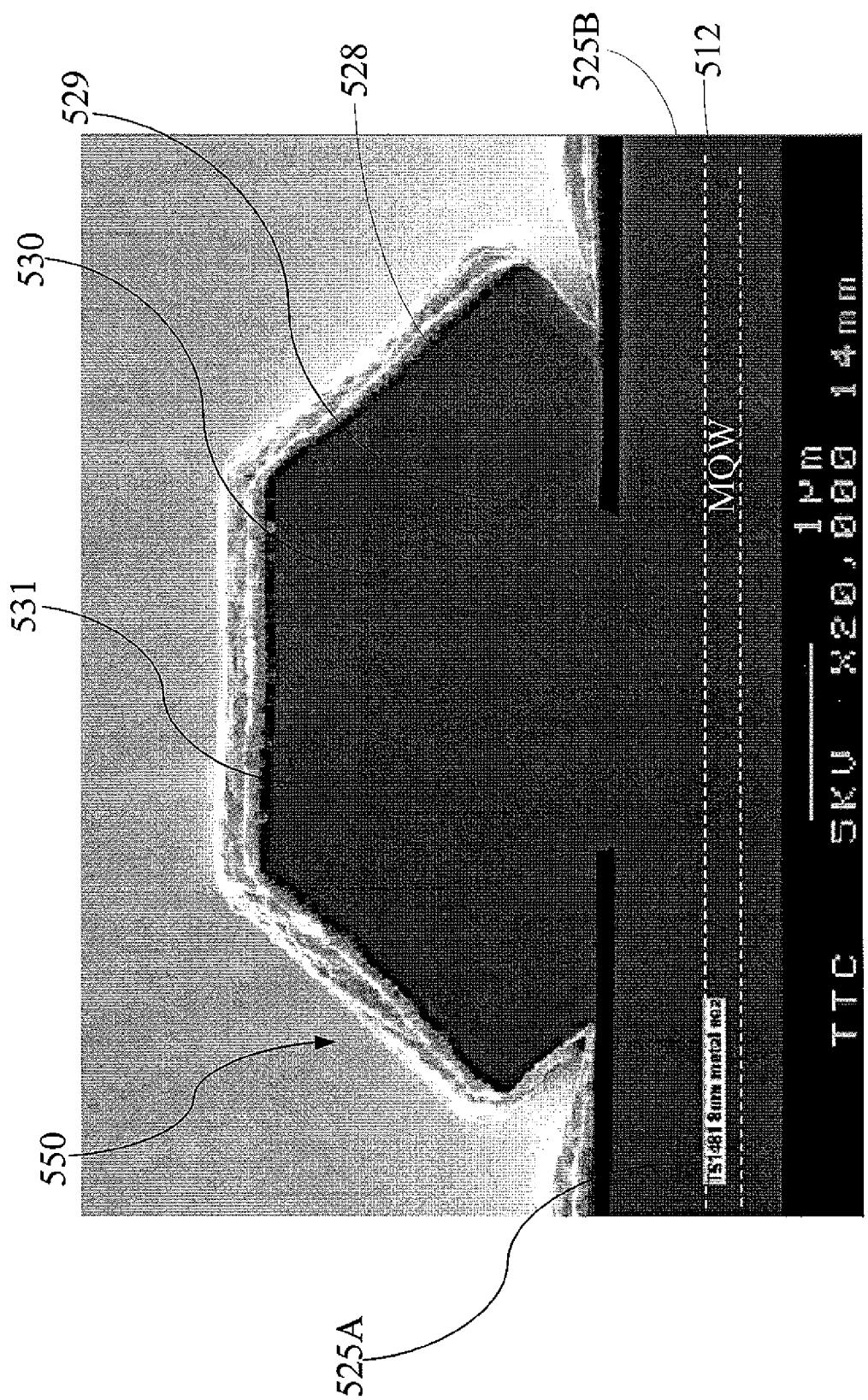
FIG. 17 is a scanning electron micrograph illustrating a cross section of a tilted ridge as schematically shown in FIG. 16.

FIG. 16 illustrates a side view of a cross-section of the DFB portion after cladding 529 and contact 530 SAG growth has occurred to create the tilted ridge structure. The process is essentially the same as described above with reference to FIGS. 6A-9B except that the mask stripes 525A and 525B are tilted with respect to the <110> directions. FIG. 17 is a scanning electron micrograph illustrating a real case of a self aligned and assembled tilted ridge structure obtained by SAG in accordance with embodiments of the invention, which corresponds to the same section represented by FIG. 16. As discussed above, the ridge 550 is formed by the growth of the cladding 529 and contact 530 layers between the stripes 525A and 525B of the pair. The neck 528 is determined only by the width of the opening between the stripes. The structure is completed by a p-metal layer 531.

Figure 18:
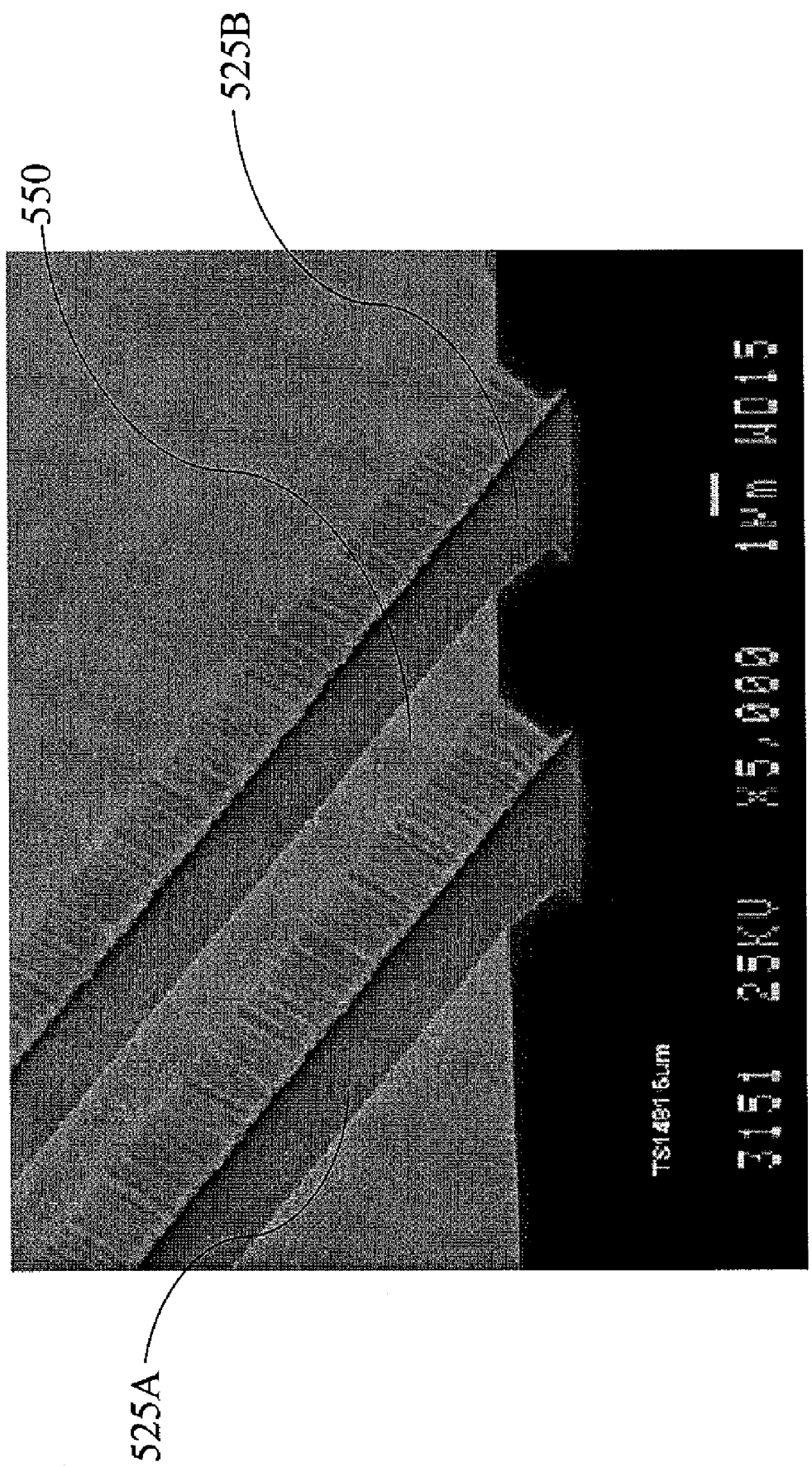
FIG. 18 is a scanning electron micrograph illustrating in accordance with an embodiment, the top perspective view of the cross section shown in FIG. 17.

FIG. 18 is a scanning electron micrograph illustrating the top view of a portion of the tilted ridge 550. The cutaway regions on either side of the ridge 550 correspond to the mask stripes 525A and 525B where the cladding and contact layers do not grow.

It should be noted that the invention has been described in detail with reference to illustrative embodiments for the purposes of demonstrating the principles and concepts of the invention. For example, although the photonic semiconductor device described herein as being an EML assembly, the invention applies equally to other types of phonic semiconductor devices, including, but not limited to, lasers, modulators, passive waveguides, photodetectors, and optical amplifiers. Also, although the semiconductor devices have been described herein with reference to particular materials (Aluminium-based materials, InP, InGaAs, etc.) and structure parameters (lengths, thicknesses, angles, widths, etc.), the invention is not limited to these materials or parameters, as will be understood by those skilled in the art in view of the description provided herein. Also, many modifications can be made to the embodiments described herein and all such modifications are within the scope of the invention.

What is claimed is:

1. An electroabsorption modulator distributed feedback laser (EML) assembly comprising an electroabsorption modulator (EAM) portion integrated with a distributed feedback laser (DFB) portion, the EML assembly comprising:

a substrate having a lower surface and an upper surface;

one or more layers including a buffer layer, one of said one or more layers having a lower surface that is in contact with the upper surface of the substrate;

one or more layers including a multi quantum well (MQW) layer, one of said one or more layers that include the MQW layer having a lower surface that is in contact with an upper surface of an uppermost layer of said one or more layers that include the buffer layer;

one or more layers including a grating layer, one of said one or more layers that include the grating layer having a lower surface that is in contact with an upper surface of one of said one or more layers that include the MQW layer, the grating layer having a diffractive grating defined in at least a portion of the grating layer;

one or more cladding and contact layers, one of said one or more cladding and contact layers having a lower surface that is in contact with an upper surface of an uppermost layer of said one or more layers that include the grating layer;

a ridge structure made of one or more cladding and contact layers that is grown on an upper surface of an uppermost layer of said one or more layers that include the grating layer, wherein the ridge structure is grown using a Selective Area Growth (SAG) technique; and an inter-contact electrical isolation region disposed between the EAM and DFB portions to electrically isolate the EAM and DFB portions from each other.

2. The EML assembly of claim 1, wherein the ridge structure has a width in a width-wise direction of the ridge structure, a height in a height-wise direction of the ridge structure and a length in a length-wise direction of the ridge structure, the length being greater than the width and height, and wherein the ridge structure is substantially straight in the lengthwise direction of the ridge structure relative to a main crystallographic axis of the substrate.

3. The EML assembly claim 1, wherein the ridge structure has a width in a width-wise direction of the ridge structure, a height in a height-wise direction of the ridge structure and a length in a length-wise direction of the ridge structure, the length being greater than the width and height, and wherein the ridge structure includes at least a portion that is substantially bent in the lengthwise direction of the ridge structure relative to a main crystallographic axis of the substrate by some angle, $\Phi$.

4. The EML assembly of claim 3, wherein $\Phi$ has a value that ranges from about 7 degrees to about 10 degrees.

5. The EML assembly of claim 1, wherein the ridge structure has a width in a width-wise direction of the ridge structure, a height in a height-wise direction of the ridge structure and a length in a length-wise direction of the ridge structure, the length being greater than the width and height, and wherein the ridge structure includes at least a portion that is substantially tilted in the lengthwise direction of the ridge structure relative to a main crystallographic axis of the substrate by some tilt angle, $\theta$.

6. The EML assembly of claim 5, wherein the diffractive grating that is defined in at least a portion of said one or more layers that include the grating layer is tilted relative to a main crystallographic axis of the substrate by the tilt angle, $\theta$, the grating having a corrugation that is substantially perpendicular to the portion of the ridge structure that is substantially tilted in the lengthwise direction.

7. The EML assembly of claim 5, wherein $\theta$ has a value that ranges from about 5 degrees to about 15 degrees.

8. The EML assembly of claim 1, wherein the diffractive grating is defined in the grating layer in the DFB portion and is not defined in the EAM portion.

9. The EML assembly of claim 8, wherein photonic semiconductor device is an aluminium (Al)-based semiconductor device, the substrate comprising n-type Indium Phosphide (InP), the buffer layer comprising n-type InP, the MQW layer comprising n-type Aluminum Gallium Indium Arsenide (AlGaInAs), the grating layer comprising one of AlGaInAs and InGaAsP, the ridge structure comprising p-type InP and p-type InGaAs.

10. A method for making an electroabsorption modulator distributed feedback laser (EML) assembly comprising an electroabsorption modulator (EAM) portion integrated with a distributed feedback laser (DFB) portion, the method comprising:

providing a substrate having a lower surface and an upper surface;

putting one or more layers including a buffer layer on the upper surface of the substrate such that a lower surface of one of said one or more layers is in contact with the upper surface of the substrate;

putting one or more layers including a multi quantum well (MQW) layer on said one or more layers that include the buffer layer such that a lower surface of one of said one or more layers that include the MQW layer is in contact with an upper surface of an uppermost layer of said one or more layers that include the buffer layer;

putting one or more layers including a grating layer on said one or more layers that include the MQW layer such that a lower surface of one of said one or more layers that include the grating layer is in contact with an upper surface of one of said one or more layers that include the MQW layer;

putting one or more cladding and contact layers on said one or more layers that include the grating layer such that a lower surface of one of said one or more cladding and contact layers is in contact with an upper surface of an uppermost layer of said one or more layers that include the grating layer;

defining a diffractive grating in at least a portion of the grating layer;

using a selective area growth (SAG) technique to grow a ridge structure on an upper surface of an uppermost layer of said one or more cladding and contact layers; and forming an inter-contact electrical isolation region between the EAM and DFB portions to electrically isolate the EAM and DFB portions from each other.

11. The method of claim 10, wherein the ridge structure has a width in a width-wise direction of the ridge structure, a height in a height-wise direction of the ridge structure and a length in a length-wise direction of the ridge structure, the length being greater than the width and height, and wherein using the SAG technique to grow the ridge structure includes selecting a masking configuration and growth conditions that cause the resulting ridge structure to be substantially straight in the lengthwise direction of the ridge structure relative to a main crystallographic axis of the substrate.

12. The method of claim 10, wherein the ridge structure has a width in a width-wise direction of the ridge structure, a height in a height-wise direction of the ridge structure and a length in a length-wise direction of the ridge structure, the length being greater than the width and height, and wherein using the SAG technique to grow the ridge structure includes selecting a masking configuration and growth conditions that cause at least a portion of the resulting ridge structure to be substantially bent in the lengthwise direction of the ridge structure relative to a main crystallographic axis of the substrate by some angle, $\Phi$.

13. The method of claim 12, wherein $\Phi$ has a value that ranges from about 7 degrees to about 10 degrees.

14. The method of claim 10, wherein the ridge structure has a width in a width-wise direction of the ridge structure, a height in a height-wise direction of the ridge structure and a length in a length-wise direction of the ridge structure, the length being great than the width and height, and wherein using the SAG technique to grow the ridge structure includes selecting a masking configuration and growth conditions that cause at least a portion of the resulting ridge structure to be substantially tilted in the lengthwise direction of the ridge structure relative to a main crystallographic axis of the substrate by some tilt angle, $\theta$.

15. The method of claim 14, wherein the diffractive grating that is defined in at least a portion of said one or more layers that include the grating layer is defined such that the defined grating is tilted relative to a main crystallographic axis of the substrate by the tilt angle, θ, and such that the defined grating has a corrugation that is substantially perpendicular to the portion of the ridge structure that is substantially tilted in the lengthwise direction.

16. The method of claim 14, wherein θ has a value that ranges from about 5 degrees to about 15 degrees.

17. The method of claim 10, wherein the diffractive grating is defined in the grating layer in the DFB portion and is not defined in the EAM portion.

18. The method of claim 17, wherein the EML assembly is an aluminium (Al)-based semiconductor device, the substrate comprising n-type Indium Phosphide (InP), the buffer layer comprising n-type InP, the MQW layer comprising n-type Aluminum Gallium Indium Arsenide (AlGaInAs), the grating layer comprising one of AlGaInAs and InGaInAs, the ridge structure comprising one of p-type InP and p-type InGaAs.

19. A photonic semiconductor device comprising:
   a substrate having a lower surface and an upper surface;
   one or more layers including a buffer layer, one of said one or more layers having a lower surface that is in contact with the upper surface of the substrate;
   one or more layers including a multi quantum well (MQW) layer, one of said one or more layers that include the MQW layer having a lower surface that is in contact with an upper surface of an uppermost layer of said one or more layers that include the buffer layer;
   one or more layers including a grating layer, one of said one or more layers that include the grating layer having a lower surface that is in contact with an upper surface of one of said one or more layers that include the MQW layer, the grating layer having a diffractive grating defined in at least a portion of the grating layer;
   one or more cladding and contact layers, one of said one or more cladding and contact layers having a lower surface that is in contact with an upper surface of an uppermost layer of said one or more layers that include the grating layer; and
   a ridge structure made of one or more cladding and contact layers that is grown on an upper surface of an uppermost layer of said one or more layers that include the grating layer, wherein the ridge structure is grown using a Selective Area Growth (SAG) technique, wherein the ridge structure has a width in a width-wise direction of the ridge structure, a height in a height-wise direction of the ridge structure and a length in a length-wise direction of the ridge structure, the length being greater than the width and height, and wherein the ridge structure includes at least a portion that is substantially tilted in the lengthwise direction of the ridge structure relative to a main crystallographic axis of the substrate by some tilt angle, θ, and wherein the diffractive grating that is defined in at least a portion of said one or more layers that include the grating layer is tilted relative to a main crystallographic axis of the substrate by the tilt angle, θ, the grating having a corrugation that is substantially perpendicular to the portion of the ridge structure that is substantially tilted in the lengthwise direction.

20. An aluminium (Al)-based photonic semiconductor device comprising:
   a substrate having a lower surface and an upper surface, the substrate comprising n-type Indium Phosphide (InP);
   one or more layers including a buffer layer, one of said one or more layers having a lower surface that is in contact with the upper surface of the substrate, the buffer layer comprising n-type InP;
   one or more layers including a multi quantum well (MQW) layer, one of said one or more layers that include the MQW layer having a lower surface that is in contact with an upper surface of an uppermost layer of said one or more layers that include the buffer layer, the MQW layer comprising n-type Aluminum Gallium Indium Arsenide (AlGaInAs);
   one or more layers including a grating layer, one of said one or more layers that include the grating layer having a lower surface that is in contact with an upper surface of one of said one or more layers that include the MQW layer, the grating layer having a diffractive grating defined in at least a portion of the grating layer, the grating layer comprising one of AlGaInAs and InGaAsP;
   one or more cladding and contact layers, one of said one or more cladding and contact layers having a lower surface that is in contact with an upper surface of an uppermost layer of said one or more layers that include the grating layer; and
   a ridge structure made of one or more cladding and contact layers that is grown on an upper surface of an uppermost layer of said one or more layers that include the grating layer, wherein the ridge structure is grown using a Selective Area Growth (SAG) technique, the ridge structure comprising p-type InP and p-type InGaAs.

21. A method for making a photonic semiconductor device, the method comprising:
   providing a substrate having a lower surface and an upper surface;
   putting one or more layers including a buffer layer on the upper surface of the substrate such that a lower surface of one of said one or more layers is in contact with the upper surface of the substrate;
   putting one or more layers including a multi quantum well (MQW) layer on said one or more layers that include the buffer layer such that a lower surface of one of said one or more layers that include the MQW layer is in contact with an upper surface of an uppermost layer of said one or more layers that include the buffer layer;
   putting one or more layers including a grating layer on said one or more layers that include the MQW layer such that a lower surface of one of said one or more layers that include the grating layer is in contact with an upper surface of one of said one or more layers that include the MQW layer;
   putting one or more cladding and contact layers on said one or more layers that include the grating layer such that a lower surface of one of said one or more cladding and contact layers is in contact with an upper surface of an uppermost layer of said one or more layers that include the grating layer;
   defining a diffractive grating in at least a portion of the grating layer; and
   using a selective area growth (SAG) technique to grow a ridge structure on an upper surface of an uppermost layer of said one or more cladding and contact layers, wherein the ridge structure has a width in a width-wise direction of the ridge structure, a height in a height-wise direction of the ridge structure and a length in a length-wise direction of the ridge structure, the length being greater than the width and height, and wherein the ridge structure includes at least a portion that is substantially tilted in the lengthwise direction of the ridge structure relative to a main crystallographic axis of the substrate by some tilt angle, θ, and wherein the diffractive grating that is defined in at least a portion of said one or more layers that include the grating layer is tilted relative to a main crystallographic axis of the substrate by the tilt angle, $\theta$, the grating having a corrugation that is substantially perpendicular to the portion of the ridge structure that is substantially tilted in the lengthwise direction.

22. A method for making an aluminium (Al)-based photonic semiconductor device, the method comprising:

providing a substrate having a lower surface and an upper surface, the substrate comprising n-type Indium Phosphide (InP);

putting one or more layers including a buffer layer on the upper surface of the substrate such that a lower surface of one of said one or more layers is in contact with the upper surface of the substrate, the buffer layer comprising n-type InP;

putting one or more layers including a multi quantum well (MQW) layer on said one or more layers that include the buffer layer such that a lower surface of one of said one or more layers that include the MQW layer is in contact with an upper surface of an uppermost layer of said one or more layers that include the buffer layer;

putting one or more layers including a grating layer on said one or more layers that include the MQW layer such that a lower surface of one of said one or more layers that include the grating layer is in contact with an upper surface of one of said one or more layers that include the MQW layer, the MQW layer comprising n-type Aluminum Gallium Indium Arsenide (AlGaInAs);

putting one or more cladding and contact layers on said one or more layers that include the grating layer such that a lower surface of one of said one or more cladding and contact layers is in contact with an upper surface of an uppermost layer of said one or more layers that include the grating layer, the grating layer comprising one of AlGaInAs and InGaAsP;

defining a diffractive grating in at least a portion of the grating layer; and using a selective area growth (SAG) technique to grow a ridge structure on an upper surface of an uppermost layer of said one or more cladding and contact layers, the ridge structure comprising p-type InP and p-type InGaAs.

* * * * *

UNITED STATES PATENT AND TRADEMARK OFFICE
CERTIFICATE OF CORRECTION

| | | |
|---|---|---|
| PATENT NO. | : 7,539,228 B2 | Page 1 of 1 |
| APPLICATION NO. | : 11/768214 | |
| DATED | : May 26, 2009 | |
| INVENTOR(S) | : Simone Codato et al. | |

It is certified that error appears in the above-identified patent and that said Letters Patent is hereby corrected as shown below:

Column 12, Line 58, Claim 14, delete "great" and insert --greater--.

Signed and Sealed this
Twenty-fifth Day of September, 2012

David J. Kappos
*Director of the United States Patent and Trademark Office*